(12) United States Patent
Dai et al.

(10) Patent No.: US 10,665,743 B2
(45) Date of Patent: May 26, 2020

(54) DISTRIBUTED/CENTRAL OPTIMIZER ARCHITECTURE

(71) Applicant: Futurewei Technologies, Inc., Plano, TX (US)

(72) Inventors: Heping Dai, Plano, TX (US); Liming Ye, Frisco, TX (US); Dianbo Fu, Frisco, TX (US); Xiaolin Mao, Plano, TX (US)

(73) Assignee: Futurewei Technologies, Inc., Plano, TX (US)

( * ) Notice: Subject to any disclaimer, the term of this patent is extended or adjusted under 35 U.S.C. 154(b) by 47 days.

(21) Appl. No.: 15/650,370

(22) Filed: Jul. 14, 2017

(65) Prior Publication Data

US 2018/0233614 A1 Aug. 16, 2018

Related U.S. Application Data

(60) Provisional application No. 62/459,774, filed on Feb. 16, 2017.

(51) Int. Cl.
*H01L 31/02* (2006.01)
*H01L 31/0443* (2014.01)
(Continued)

(52) U.S. Cl.
CPC ...... *H01L 31/0504* (2013.01); *H01L 31/0201* (2013.01); *H01L 31/0443* (2014.12);
(Continued)

(58) Field of Classification Search
USPC .......................................................... 307/82
See application file for complete search history.

(56) References Cited

U.S. PATENT DOCUMENTS

| 4,672,944 A | 6/1987 | Curry |
| 6,158,426 A | 12/2000 | Wardell |

(Continued)

FOREIGN PATENT DOCUMENTS

| CN | 102457068 A | 5/2012 |
| CN | 102882233 | * 1/2013 |

(Continued)

OTHER PUBLICATIONS

International Search Report & The Written Opinion of the International Searching Authority dated May 10, 2018, International Application No. PCT/CN2018/076264, 9 pages.

(Continued)

*Primary Examiner* — Hal Kaplan
*Assistant Examiner* — Xuan Ly
(74) *Attorney, Agent, or Firm* — Vierra Magen Marcus LLP

(57) ABSTRACT

The disclosure relates to technology for providing power, voltage, and/or current from a combination of photovoltaic modules. In one aspect, a system has central power optimizer, which is located between a group of distributed power optimizers and a solar inverter. Each distributed power optimizer may be connected to the DC output of one photovoltaic modules, and may be used to regulate the power output of the photovoltaic module. The combined DC voltages of the distributed power optimizers may be provided to the input of the central power optimizer.

20 Claims, 26 Drawing Sheets

(51) Int. Cl.
  *H01L 31/05* (2014.01)
  *H01L 31/18* (2006.01)
  *H02S 30/10* (2014.01)
  *H02S 50/00* (2014.01)
  *H01L 31/0224* (2006.01)

(52) U.S. Cl.
  CPC ...... *H01L 31/0516* (2013.01); *H01L 31/1896* (2013.01); *H02S 30/10* (2014.12); *H02S 50/00* (2013.01); *H01L 31/022433* (2013.01); *H01L 31/022441* (2013.01); *Y02E 10/50* (2013.01); *Y02P 70/521* (2015.11)

(56) References Cited

U.S. PATENT DOCUMENTS

| | | | |
|---|---|---|---|
| 6,257,227 B1 | 7/2001 | Harbin | |
| 6,336,397 B1 | 1/2002 | Michel et al. | |
| 8,004,116 B2 | 8/2011 | Ledenev et al. | |
| 8,093,757 B2 | 1/2012 | Wolfs | |
| 9,088,178 B2 | 7/2015 | Adest et al. | |
| 9,806,523 B2 | 10/2017 | Stratakos et al. | |
| 10,135,332 B2 | 11/2018 | Tanifuji | |
| 2006/0185727 A1* | 8/2006 | Matan | H01L 31/02021 136/244 |
| 2009/0284998 A1 | 11/2009 | Zhang et al. | |
| 2012/0042588 A1 | 2/2012 | Erickson, Jr. | |
| 2013/0249300 A1 | 9/2013 | Fishman et al. | |
| 2014/0327313 A1* | 11/2014 | Arditi | H01L 31/02021 307/63 |
| 2016/0006250 A1* | 1/2016 | Ramond | H01L 31/02021 307/82 |
| 2016/0164298 A1 | 6/2016 | Baba | |
| 2017/0179877 A1 | 6/2017 | Sella et al. | |
| 2017/0222542 A1 | 8/2017 | Adest et al. | |
| 2017/0271878 A1* | 9/2017 | Feng | H02S 50/00 |

FOREIGN PATENT DOCUMENTS

| | | |
|---|---|---|
| CN | 102882233 A | 1/2013 |
| CN | 203313097 U | 11/2013 |
| CN | 103166239 B | 7/2015 |
| CN | 106230288 A | 12/2016 |
| DE | 102012217554 A1 | 3/2014 |
| EP | 2693289 A1 | 2/2014 |

OTHER PUBLICATIONS

Response to Office Action dated Jun. 11, 2018, U.S. Appl. No. 15/489,278, filed Apr. 17, 2017, 12 pages.
U.S. Appl. No. 15/489,278, filed Apr. 17, 2017, by Dai et al.
English Abstract of DE Publication No. DE102012217554A1 published on Mar. 27, 2014.
Final Office Action dated Oct. 4, 2018, U.S. Appl. No. 15/489,278, filed Apr. 17, 2017.
Notice of Allowance dated Feb. 7, 2019, U.S. Appl. No. 15/489,278, filed Apr. 17, 2017.
Non-final Office Action dated Mar. 12, 2018, U.S. Appl. No. 15/489,278, filed Apr. 17, 2017.
Response to Office Action dated Jan. 3, 2019, U.S. Appl. No. 15/489,278, filed Apr. 17, 2017.
Office Action dated May 14, 2019, in U.S. Appl. No. 15/650,355.
Extended European Search Report dated Dec. 6, 2019, European Patent Application No. 18753533.1.

\* cited by examiner

DISTRIBUTED/CENTRAL OPTIMIZER ARCHITECTURE

CLAIM OF PRIORITY

The present application claims priority from U.S. Provisional Patent Application No. 62/459,774, entitled "PHOTO-VOLTAIC PANEL MISMATCH ADAPTIVE DISTRIBUTED CENTRAL OPTIMIZER ARCHITECTURE," by Dai et al., filed Feb. 16, 2017, incorporated by reference herein in its entirety.

BACKGROUND

Photovoltaic modules generate Direct Current (DC) voltages. Typically, the DC voltage and DC current from one photovoltaic module is well below the needs of the voltage and current needed for the Alternating Current (AC) power grid. Typically, many photovoltaic modules are used in combination within a photovoltaic power generation system to provide the necessary voltage and current for the AC power grid. The DC voltages/currents also need to be converted to AC voltages/currents.

One significant challenge is to operate the photovoltaic modules for maximum power efficiency. For at least some photovoltaic modules, there is an output voltage at which the photovoltaic module will produce a maximum power output. The maximum power can vary with factors such as solar radiation and temperature of the photovoltaic panel. Moreover, the conditions at the various photovoltaic modules can differ from each other. Thus, for the photovoltaic power generation system to operate at or near optimum power efficiency, the various photovoltaic modules might need to be operated at different output voltages.

There are also challenges with operating other power generation systems, such as those that provide power from a collection of DC batteries.

BRIEF SUMMARY

A first embodiment includes a system comprising photovoltaic modules, each having a DC voltage output. The system also has distributed power optimizers. Each distributed power optimizer has an input connected to the DC voltage output of one of the photovoltaic modules and a DC voltage output. The system also has a central optimizer having a DC voltage output and an input connected to the combined DC voltage output of a set of the distributed power optimizers.

In a second embodiment, and in accordance with the first embodiment, the central optimizer is configured to operate in a bypass mode and in a boost mode.

In a third embodiment, and in accordance with the first through second embodiments, the system further comprises control logic configured to switch the central optimizer between the bypass mode and the boost mode responsive to a condition of one or more of the plurality of distributed power optimizers.

In a fourth embodiment, and in accordance with the first through third embodiments, the system further comprises control logic configured to switch the central optimizer from the bypass mode to the boost mode responsive to a magnitude of a DC voltage output of one or more of the plurality of distributed power optimizers reaching a maximum allowed amount.

In a fifth embodiment, and in accordance with the first through fourth embodiments, the system further comprises control logic configured to switch the central optimizer from the bypass mode to the boost mode responsive to the central optimizer being unable to maintain the DC voltage output of the central optimizer at a target level.

In a sixth embodiment, and in accordance with the first through fifth embodiments, the central optimizer comprises a switch between the input of the central optimizer and the DC voltage output of the central optimizer, wherein in the bypass mode the switch connects the input of the central optimizer directly to the output of the central optimizer.

In a seventh embodiment, and in accordance with the first through sixth embodiments, the system further comprises control logic configured to reduce the combined DC voltage output of the plurality of distributed power optimizers when the central optimizer is in the boost mode relative to the combined DC voltage output of the plurality of distributed power optimizers when the central optimizer is in the bypass mode.

In an eighth embodiment, and in accordance with the first through seventh embodiments, the central optimizer is configured to maintain the DC voltage output of the central optimizer at substantially the same magnitude in the boost mode and the bypass mode.

In a ninth embodiment, and in accordance with the first through eighth embodiments, the system further comprises a DC to AC converter having a DC voltage input and an AC voltage output, wherein the DC voltage input of the DC to AC converter is coupled to the DC voltage output of the central optimizer.

In a tenth embodiment, and in accordance with the first through ninth embodiments, the system further comprises control logic configured to report operational status of the plurality of distributed power optimizers to the central optimizer, wherein the operational status comprises one or more of: a normal state of a distributed power optimizer, an output voltage limiting state in which a distributed power optimizer limits its output voltage, or an output power limiting state in which a distributed power optimizer limits its output power.

In a eleventh embodiment, and in accordance with the first through tenth embodiments, the system further comprises control logic configured to report abnormal conditions to one or more of the plurality of distributed power optimizers, wherein the abnormal conditions comprises one or more of: an under-voltage condition at the input of the central optimizer, or an over voltage condition at the input of the central optimizer.

A twelfth embodiment includes a method of regulating power, comprising: operating a plurality of distributed power optimizers to regulate power output of a plurality of photovoltaic modules, each distributed power optimizer having a DC voltage output and an input connected to the DC voltage output of one of the photovoltaic modules; providing a total DC voltage output of the plurality distributed power optimizers to a central optimizer; operating the central optimizer in a boost mode or a bypass mode; and providing a DC output voltage of the central optimizer to an input of a solar inverter.

In a thirteenth embodiment, and in accordance with the twelfth embodiment operating the central optimizer in a boost mode or a bypass mode comprises: operating the central optimizer in the boost mode responsive to a condition of one or more of the plurality of distributed power optimizers.

In a fourteenth embodiment, and in accordance with the twelfth through thirteenth embodiments the condition is a first of the plurality of distributed power optimizers having its output voltage clamped to a maximum allowed voltage.

In a fifteenth embodiment, and in accordance with the twelfth through fourteenth embodiments operating the central optimizer in a boost mode or a bypass mode comprises: operating the central optimizer in the bypass mode responsive to all of the plurality of distributed power optimizers reporting normal state; and operating the central optimizer in the boost mode responsive to one of more of the plurality of distributed power optimizers reporting abnormal state.

In a sixteenth embodiment, and in accordance with the twelfth through fifteenth embodiments operating the central optimizer in a boost mode or a bypass mode comprises: decreasing the ratio of the DC voltage at the input to the output of the central optimizer when going from the bypass mode to the boost mode.

A seventeenth embodiment includes a photovoltaic power transfer system, comprising a plurality of central optimizer systems connected in series and/or parallel Each central optimizer system comprises a plurality of power modules connected in series. Each of the power modules comprises: a plurality of photovoltaic modules, each having a DC voltage output; a plurality of distributed power optimizers, each distributed power optimizer has an input connected to the DC voltage output of one of the photovoltaic modules and a DC voltage output; and a central optimizer having a DC voltage output and an input connected to the combined DC voltage output of a set of the distributed power optimizers.

In an eighteenth embodiment, and in accordance with the seventeenth embodiment, the system further comprises a solar inverter having an input that receives a combined DC voltage output of the central optimizers in a series connected string of the central optimizer systems.

In a nineteenth embodiment, and in accordance with the seventeenth through eighteenth embodiments, the plurality of central optimizer systems comprises a plurality of series connected strings of the central optimizer systems connected in parallel, wherein the solar inverter input receives a combined DC voltage output of the central optimizers in each of the series connected strings.

In a twentieth embodiment, and in accordance with the seventeenth through nineteenth embodiments, each of the central optimizers is configured to operate in a bypass mode and in a boost mode. Also, control logic is configured to switch ones of the central optimizers between the bypass mode and the boost mode responsive to a condition of one or more of the plurality of distributed power optimizers.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

BRIEF DESCRIPTION OF THE DRAWINGS

Aspects of the present disclosure are illustrated by way of example and are not limited by the accompanying figures for which like references indicate like elements.

DETAILED DESCRIPTION

Figure 1:
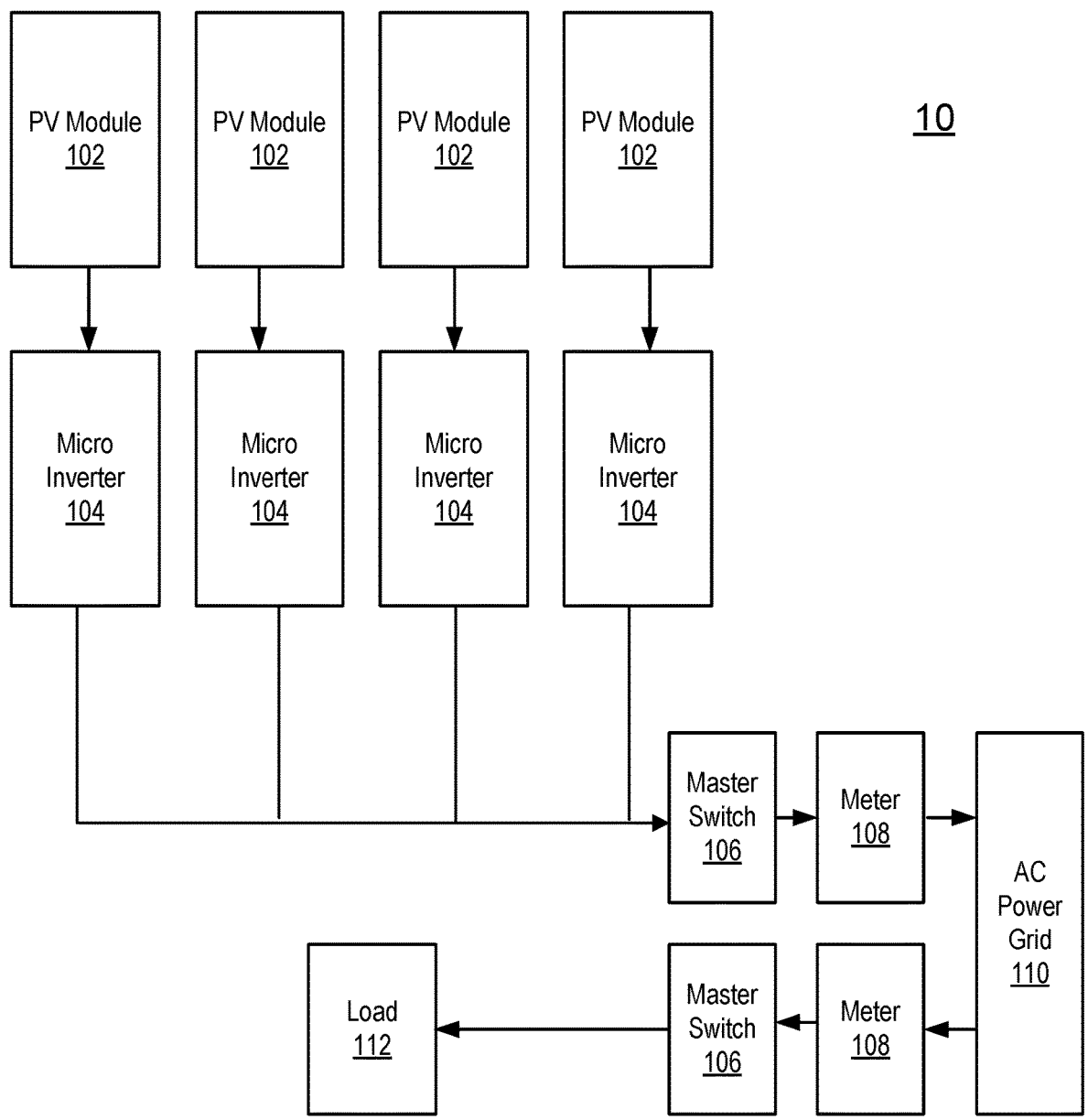
FIG. 1 is an example of a conventional system having a micro-inverter associated with each photovoltaic (PV) panel.

The disclosure relates to technology for providing power, voltage, and/or current from a combination of DC sources.

The DC sources may be power sources. In one embodiment, the DC sources are photovoltaic (e.g., solar) modules. In one embodiment, the DC sources are DC batteries.

One embodiment of a series stacked system includes a stack of DC power sources (e.g., photovoltaic modules) with a DC to DC converter (e.g., power optimizer) associated with each DC power source. An output capacitor of a DC to DC converter is connected in series with its DC power source. Thus, there is a string of DC power sources and output capacitors connected in electrical series, in this embodiment. Thus, this embodiment locates the output capacitor of a DC to DC converter in series with the DC power sources. The DC output of one embodiment of a series stacked system is a series connection of the DC power sources and the output capacitors. This reduces stress on the output capacitors, while allowing for efficient power generation by the DC power sources. Embodiments disclosed herein reduce or eliminate the need to limit the output voltage of the DC to DC converters. Reducing the output voltage of DC to DC converters could decrease efficiency in power generation by the DC power sources. Hence, embodiments provide for efficient power generation.

In one embodiment, a distributed/central optimizer system has central power optimizer, which is located between a group of distributed power optimizers (which may include DC to DC converters) and a solar inverter. Each distributed power optimizer may be connected to the DC output of one photovoltaic module, and may be used to regulate the power output of the photovoltaic module. The combined DC voltages of the distributed power optimizers may be provided to the input of the central power optimizer. The central power optimizer may have two modes: 1) bypass mode, in which it passes the combined voltage from the distributed power optimizers to the solar inverter; and 2) boost mode, in which it boosts the combined voltages from the distributed power optimizers. This allows the distributed power optimizers to output a lower voltage, which can reduce stress on components of the distributed power optimizers such as output capacitors. It can also prevent the need to shut down the system or limit output voltages of the distributed power optimizers.

In one embodiment, the distributed/central optimizer system is configured to select the boost mode for the central power optimizer when one or more of the distributed power optimizers is unable to provide a target voltage for some reason. For example, the output voltage of a distributed power optimizer might be clamped to prevent damage to the distributed power optimizer. Note that were the central power optimizer not present, this implies that the distributed power optimizers would be unable to provide the target voltage to the solar inverter. One possible reason for the failure to meet the target voltage is a mismatch of voltage output of the solar panels. The system may be configured to select the bypass mode when the distributed power optimizers are able to provide the proper voltage to the solar inverter.

The distributed/central optimizer system may also be configured to reduce the combined voltage of the distributed power optimizers when the central power optimizer is in the boost mode. The central power optimizer may make up for the drop in this combined voltage by boosting it. The result is that the output voltage of the central power optimizer may be the same whether in boost mode or bypass mode. This means that the input voltage of the solar inverter may be the same in either mode. Note that switching to the bypass mode may allow the system to operate more efficiently than leaving the system in the boost mode all the time.

FIG. 1 is an example of a conventional system 10 having a micro-inverter 104 associated with each photovoltaic (PV) module 102. A photovoltaic module 102 may also be referred to herein as a solar module. Each micro-inverter 104 converts DC voltage/current from a PV module to AC voltage/current. The micro-inverter 104 also attempts to optimize the transfer of power from the PV module to the AC power grid 110. Typically, there is one micro-inverter 104 per photovoltaic module 102. The output from several micro-inverters 104 is combined and may be fed to the AC power grid 110. In this example, the combined output is fed to a master switch 106, which is connected to a meter 108. The power from the AC power grid 110 is provided to a load 112. A drawback of system 10 is the high cost of the micro-inverters 104.

Figure 2:
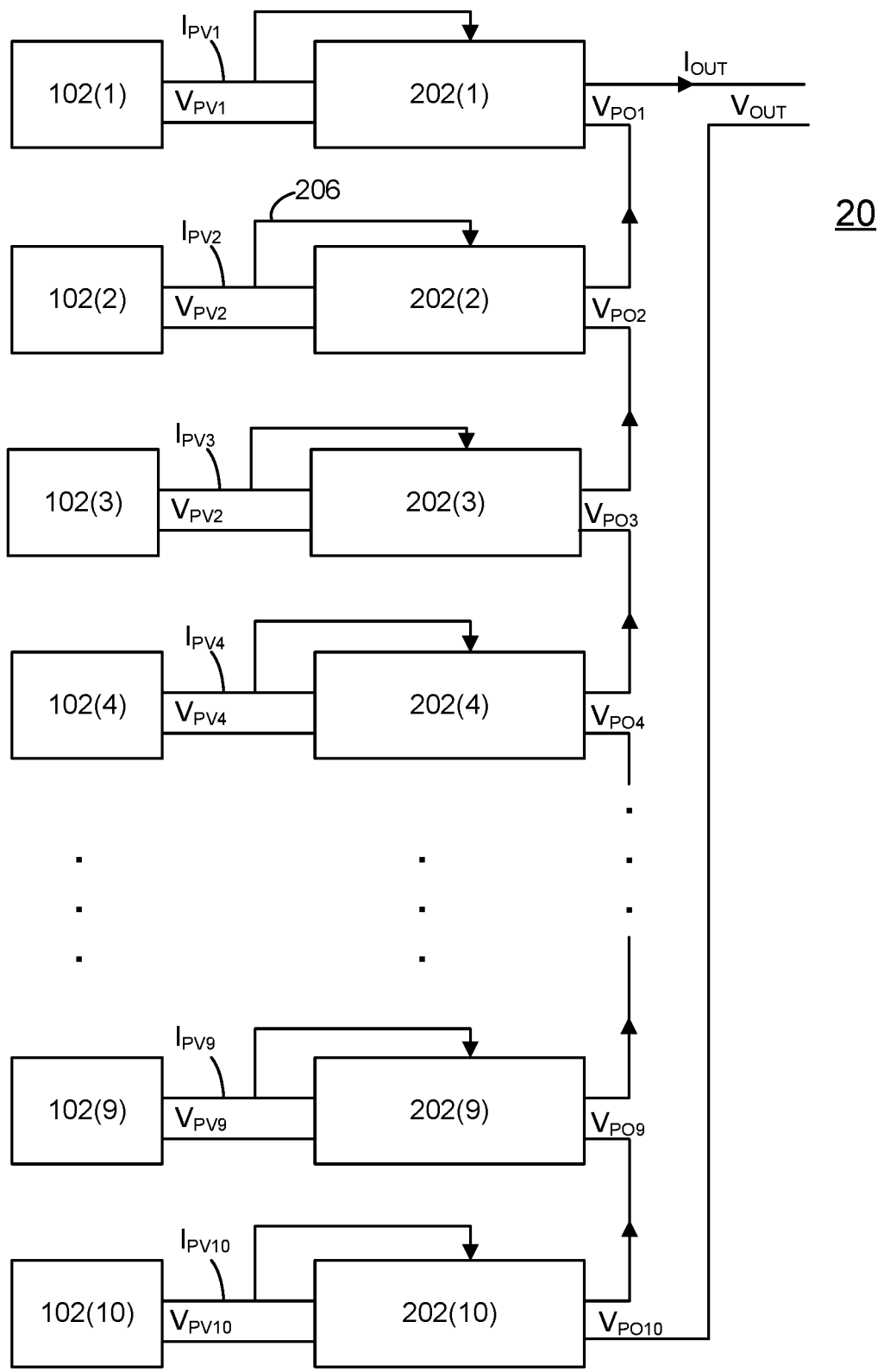
FIG. 2 is an example of a conventional system having DC distributed power optimizers.

FIG. 2 is an example of a conventional system 20 having DC power optimizers 202(1)-202(10). Each DC power optimizer 202 is connected to one photovoltaic module 102(1)-102(10). Each photovoltaic module 102 has an output voltage ($V_{PV1}$ through $V_{PV10}$) and an output current ($I_{PV1}$ through $I_{PV10}$). The output (current and/or voltage) of each photovoltaic module 102 is sampled and used to control one of the power optimizers 202 in order to optimize the power output of each respective photovoltaic module 102 (see, for example, control signal 206). Each power optimizer 202 has a DC voltage output ($V_{PO1}$ through $V_{PO10}$). The total output voltage ($V_{OUT}$) of the system 20 is the sum of the DC voltage outputs ($V_{PO1}$ through $V_{PO10}$). The power optimizers 202 are connected together such that a series output current $I_{OUT}$ is provided. Note that the DC output voltage and output current may be provided to the input of a DC to AC converter (not depicted in FIG. 2).

Under ideal conditions, each photovoltaic module 102 produces the same wattage. For example, each photovoltaic module 102 might produce 200 Watts (W). As one example, under ideal conditions, each DC power optimizer 202 outputs 35 Volts (V). Thus, the system DC output voltage is 350 V. Under these conditions, the system output current might be 5.7 Amperes (A).

However, under typical operating conditions, there will be some variance between the power output of the respective photovoltaic modules 102. For example, one of more of the photovoltaic modules 102 may be at least partially shaded. Under partial shading conditions, the output voltages of the DC power optimizers 202 may change in order to attempt to maximum the power output of the photovoltaic modules 102. Consider, for the sake of example, that photovoltaic module 102(9) is shaded and produces only 80 W (with the rest still producing 200 W). Under these non-ideal conditions, the DC power optimizer 202(9) associated with the shaded photovoltaic module 102(9) may output 14.9V. The rest of the DC power optimizers 202 may output 37.2 Volts (V). This results in the essentially the same output voltage (349.7V).

The DC power optimizers 202 may have buck convertors, boost converters, buck-boost convertors, or other types of DC to DC convertors. Tables I-VIII describe shading problems associated with conventional DC optimizers. Each table contains a current-voltage for each photovoltaic module 102 that may result in a maximum power output under the present environmental conditions. Table I describes an optimum case, as a point of reference.

TABLE I

| PV | $I_{PV}$ | $V_{PV}$ | $P_{PV}$ | $P_{PVT}$ | $V_{OUT}$ | $I_{OUT}$ | Mode | Duty | $V_{PO}$ |
|---|---|---|---|---|---|---|---|---|---|
| 1 | 10 | 30 | 300 | 3000 | 350 | 8.57 | Boost | 0.14 | 35 |
| 2 | 10 | 30 | 300 |  |  | 8.57 | Boost | 0.14 | 35 |
| 3 | 10 | 30 | 300 |  |  | 8.57 | Boost | 0.14 | 35 |
| 4 | 10 | 30 | 300 |  |  | 8.57 | Boost | 0.14 | 35 |
| 5 | 10 | 30 | 300 |  |  | 8.57 | Boost | 0.14 | 35 |
| 6 | 10 | 30 | 300 |  |  | 8.57 | Boost | 0.14 | 35 |
| 7 | 10 | 30 | 300 |  |  | 8.57 | Boost | 0.14 | 35 |
| 8 | 10 | 30 | 300 |  |  | 8.57 | Boost | 0.14 | 35 |
| 9 | 10 | 30 | 300 |  |  | 8.57 | Boost | 0.14 | 35 |
| 10 | 10 | 30 | 300 |  |  | 8.57 | Boost | 0.14 | 35 |

In Table I all photovoltaic modules produce 300 W. The output voltage $V_{OUT}$ (which may be the input to a DC to AC inverter) is 350V. Note that due to the series connection of the DC power optimizers 202, the output current of each DC power optimizer 202 is the same as the total system output current $I_{OUT}$. In this example, $I_{OUT}$ is 8.57 A. Table I is for a case in which the DC power optimizers 202 are operated in a boost mode, with a duty cycle of 0.14. Note that the DC power optimizers 202 are able to collectively provide 350V. Also, note that all the photovoltaic modules 102 are able to be operated at their maximum power points.

TABLE II

| PV | $I_{PV}$ | $V_{PV}$ | $P_{PV}$ | $P_{PVT}$ | $V_{OUT}$ | $I_{OUT}$ | Mode | Duty | $V_{PO}$ |
|---|---|---|---|---|---|---|---|---|---|
| 1 | 3 | 24 | 72 | 1860 | 350 | 5.31 | Buck | 0.56 | 13.55 |
| 2 | 3 | 24 | 72 |  |  | 5.31 | Buck | 0.56 | 13.55 |
| 3 | 3 | 24 | 72 |  |  | 5.31 | Buck | 0.56 | 13.55 |
| 4 | 3 | 24 | 72 |  |  | 5.31 | Buck | 0.56 | 13.55 |
| 5 | 3 | 24 | 72 |  |  | 5.31 | Buck | 0.56 | 13.55 |
| 6 | 10 | 30 | 300 |  |  | 5.31 | Boost | 0.47 | 56.45 |
| 7 | 10 | 30 | 300 |  |  | 5.31 | Boost | 0.47 | 56.45 |
| 8 | 10 | 30 | 300 |  |  | 5.31 | Boost | 0.47 | 56.45 |
| 9 | 10 | 30 | 300 |  |  | 5.31 | Boost | 0.47 | 56.45 |
| 10 | 10 | 30 | 300 |  |  | 5.31 | Boost | 0.47 | 56.45 |

Table II describes a case in which photovoltaic modules 102(1)-102(5) are partially shaded and each produce only 72 W. Those PV modules are operated at 24V and 3 A to be at a maximum power point. In this case, the total power output of the photovoltaic modules is 1860 W. The output voltage $V_{OUT}$ is again 350V. In this case, the output current $I_{OUT}$ is 5.31 A. One possible solution is for DC power optimizers 202(6)-202(10) to operate in boost mode to increase the DC voltage from the PV module from 30V to 56.45V. A duty cycle of about 0.47 may be sufficient. The other DC power optimizers 202(1)-202(5) may operate in buck mode to reduce the DC voltage from 24V to 13.55V.

For the sake of argument, the solution in Table II may be acceptable. The DC power optimizers 202 are able to collectively provide 350V. Also, each photovoltaic module 102 is operated at a current-voltage that results in maximum power output.

TABLE III

| PV | $I_{PV}$ | $V_{PV}$ | $P_{PV}$ | $P_{PVT}$ | $V_{OUT}$ | $I_{OUT}$ | Mode | Duty | $V_{PO}$ |
|---|---|---|---|---|---|---|---|---|---|
| 1 | 3 | 24 | 72 | 1632 | 350 | 4.66 | Buck | 0.64 | 15.44 |
| 2 | 3 | 24 | 72 |  |  | 4.66 | Buck | 0.64 | 15.44 |
| 3 | 3 | 24 | 72 |  |  | 4.66 | Buck | 0.64 | 15.44 |
| 4 | 3 | 24 | 72 |  |  | 4.66 | Buck | 0.64 | 15.44 |
| 5 | 3 | 24 | 72 |  |  | 4.66 | Buck | 0.64 | 15.44 |
| 6 | 3 | 24 | 72 |  |  | 4.66 | Buck | 0.64 | 15.44 |
| 7 | 10 | 30 | 300 |  |  | 4.66 | Boost | 0.53 | 64.34 |
| 8 | 10 | 30 | 300 |  |  | 4.66 | Boost | 0.53 | 64.34 |
| 9 | 10 | 30 | 300 |  |  | 4.66 | Boost | 0.53 | 64.34 |
| 10 | 10 | 30 | 300 |  |  | 4.66 | Boost | 0.53 | 64.34 |

In the example in Table III, four photovoltaic modules have the same 300 W output. However, six others generate just 72 W. The output voltage $V_{OUT}$ is again 350V. In this case, the output current $I_{OUT}$ is 4.66 A. One possible solution to reach the desired 350V output is for four DC power optimizers (202(7) to 202(10)) to operate in boost mode to increase the DC voltage from the PV module from 30V to 64.34V. A duty cycle of about 0.53 may be sufficient. The other six DC distributed power optimizers may operate in buck mode to reduce the DC voltage from 24V to 15.44V. A problem with this solution is the high voltage required on the output of the DC distributed power optimizers (202(7) to 202(10)) in boost mode. Note that there may be an output capacitor in these DC power optimizers (202(7) to 202(10)) that is put under severe strain. More severely, the power transistors in the optimizers will need higher voltage rated devices for safe operation and that will increase system cost and reduce efficiency.

The situation in Table III results in what is referred to herein as an "over-voltage" problem. One possible technique to deal with this over-voltage is to shut down the entire system such that components such as an output capacitor in DC power optimizers (202(7) to 202(10)) are not damaged. However, this comes at the great expense of not generating any power. Another possible technique to deal with this over-voltage is to clamp the output voltage of DC power optimizers (202(7) to 202(10)) to a safe operating level. However, this will reduce the system's power output. Also, $V_{OUT}$ may be reduced below 350V. The solar inverter might not operate efficiently with a lower voltage. In fact, the solar inverter might not operate at all if its DC input voltage is reduced too much.

TABLE IV

| PV | $I_{PV}$ | $V_{PV}$ | $P_{PV}$ | $P_{PVT}$ | $V_{OUT}$ | $I_{OUT}$ | Mode | Duty | $V_{PO}$ |
|---|---|---|---|---|---|---|---|---|---|
| 1 | 3 | 24 | 72 | 948 | 350 | 2.71 | Boost | 0.1 | 26.58 |
| 2 | 3 | 24 | 72 |  |  | 2.71 | Boost | 0.1 | 26.58 |
| 3 | 3 | 24 | 72 |  |  | 2.71 | Boost | 0.1 | 26.58 |
| 4 | 3 | 24 | 72 |  |  | 2.71 | Boost | 0.1 | 26.58 |
| 5 | 3 | 24 | 72 |  |  | 2.71 | Boost | 0.1 | 26.58 |
| 6 | 3 | 24 | 72 |  |  | 2.71 | Boost | 0.1 | 26.58 |
| 7 | 3 | 24 | 72 |  |  | 2.71 | Boost | 0.1 | 26.58 |
| 8 | 3 | 24 | 72 |  |  | 2.71 | Boost | 0.1 | 26.58 |
| 9 | 3 | 24 | 72 |  |  | 2.71 | Boost | 0.1 | 26.58 |
| 10 | 10 | 30 | 300 |  |  | 2.71 | Boost | 0.73 | 110.8 |

In Table IV, one photovoltaic module has 300 W output. However, nine others generate just 72 W. Those nine PV module are operated at 24V and 3 A in order to operate at the maximum power point of 72 W. The output voltage $V_{OUT}$ is again 350V. In this case, the output current $I_{OUT}$ is 2.71 A. One possible solution to achieve the 350V output is for DC power optimizer 202(10) to operate in boost mode to increase the DC voltage from its PV module 102(10) from 30V to 110.8V. A duty cycle of about 0.73 may be sufficient. The other nine DC power optimizers may operate in boost mode to increase the DC voltage from 24V to 26.58V. A problem with this solution is the high voltage required on the output of the DC power optimizer 202(10). Note that there may be an output capacitor in DC power optimizer 202(10)

that is put under severe strain due to this large voltage. More severely, the power transistors in the optimizers will need higher voltage rated devices for safe operation and that will increase system cost and reduce efficiency.

The situation in Table IV also results in an over-voltage problem. However, this example is a much more serve over-voltage problem than the one in Table III. Hence, the total voltage $V_{OUT}$ might need to be reduced far below 350V. Thus, it could be even more difficult for the solar inverter to operate properly, relative to the example in Table III.

TABLE V

| PV | $I_{PV}$ | $V_{PV}$ | $P_{PV}$ | $P_{PVT}$ | $V_{OUT}$ | $I_{OUT}$ | Mode | Duty | $V_{PO}$ |
|---|---|---|---|---|---|---|---|---|---|
| 1 | 10 | 30 | 300 | 3000 | 200 | 15 | Buck | 0.67 | 20 |
| 2 | 10 | 30 | 300 | | | 15 | Buck | 0.67 | 20 |
| 3 | 10 | 30 | 300 | | | 15 | Buck | 0.67 | 20 |
| 4 | 10 | 30 | 300 | | | 15 | Buck | 0.67 | 20 |
| 5 | 10 | 30 | 300 | | | 15 | Buck | 0.67 | 20 |
| 6 | 10 | 30 | 300 | | | 15 | Buck | 0.67 | 20 |
| 7 | 10 | 30 | 300 | | | 15 | Buck | 0.67 | 20 |
| 8 | 10 | 30 | 300 | | | 15 | Buck | 0.67 | 20 |
| 9 | 10 | 30 | 300 | | | 15 | Buck | 0.67 | 20 |
| 10 | 10 | 30 | 300 | | | 15 | Buck | 0.67 | 20 |

Tables V-VIII describe shading problems associated with conventional buck optimizers. The conditions at the PV modules is the similar (though not identical) as in Tables I-IV. However, now the output voltage $V_{OUT}$ (which may be the input to a solar inverter) is only 200V.

In Table V, all ten photovoltaic modules have the same 300 W output. Each PV module is operated at 30V and 10 A. The system output voltage $V_{OUT}$ is 200V. Thus, the system output current is 15 A. One possible solution is for each power optimizer 202 to decrease the DC voltage from the PV module from 30V to 20V. A duty cycle of about 0.67 may be sufficient.

TABLE VI

| PV | $I_{PV}$ | $V_{PV}$ | $P_{PV}$ | $P_{PVT}$ | $V_{OUT}$ | $I_{OUT}$ | Mode | Duty | $V_{PO}$ |
|---|---|---|---|---|---|---|---|---|---|
| 1 | 3 | 24 | 72 | 2088 | 200 | 10.44 | Buck | 0.29 | 6.897 |
| 2 | 3 | 24 | 72 | | | 10.44 | Buck | 0.29 | 6.897 |
| 3 | 3 | 24 | 72 | | | 10.44 | Buck | 0.29 | 6.897 |
| 4 | 3 | 24 | 72 | | | 10.44 | Buck | 0.29 | 6.897 |
| 5 | 10 | 30 | 300 | | | 10.44 | Buck | 0.96 | 28.74 |
| 6 | 10 | 30 | 300 | | | 10.44 | Buck | 0.96 | 28.74 |
| 7 | 10 | 30 | 300 | | | 10.44 | Buck | 0.96 | 28.74 |
| 8 | 10 | 30 | 300 | | | 10.44 | Buck | 0.96 | 28.74 |
| 9 | 10 | 30 | 300 | | | 10.44 | Buck | 0.96 | 28.74 |
| 10 | 10 | 30 | 300 | | | 10.44 | Buck | 0.96 | 28.74 |

In Table VI, six photovoltaic modules have the same 300 W output. However, four others generate just 72 W. Those four PV modules are operated at 24V and 3 A to be at the maximum power point. The system output voltage $V_{OUT}$ is 200V. Thus, the system output voltage current is 10.44 A. One possible solution to achieve the 200V output is for four DC power optimizers to operate in buck mode with a duty cycle of about 0.29 in order to decrease the DC voltage from 24V to 6.897V. Six DC power optimizers decrease the DC voltage from 30V to 28.74V.

TABLE VII

| PV | $I_{PV}$ | $V_{PV}$ | $P_{PV}$ | $P_{PVT}$ | $V_{OUT}$ | $I_{OUT}$ | Mode | Duty | $V_{PO}$ |
|---|---|---|---|---|---|---|---|---|---|
| 1 | 3 | 24 | 72 | 1860 | 200 | 9.3 | Buck | 0.32 | 7.742 |
| 2 | 3 | 24 | 72 | | | 9.3 | Buck | 0.32 | 7.742 |

TABLE VII-continued

| PV | $I_{PV}$ | $V_{PV}$ | $P_{PV}$ | $P_{PVT}$ | $V_{OUT}$ | $I_{OUT}$ | Mode | Duty | $V_{PO}$ |
|---|---|---|---|---|---|---|---|---|---|
| 3 | 3 | 24 | 72 | | | 9.3 | Buck | 0.32 | 7.742 |
| 4 | 3 | 24 | 72 | | | 9.3 | Buck | 0.32 | 7.742 |
| 5 | 3 | 24 | 72 | | | 9.3 | Buck | 0.32 | 7.742 |
| 6 | 10 | 30 | 300 | | | 9.3 | Boost | 0.07 | 32.26 |
| 7 | 10 | 30 | 300 | | | 9.3 | Boost | 0.07 | 32.26 |
| 8 | 10 | 30 | 300 | | | 9.3 | Boost | 0.07 | 32.26 |
| 9 | 10 | 30 | 300 | | | 9.3 | Boost | 0.07 | 32.26 |
| 10 | 10 | 30 | 300 | | | 9.3 | Boost | 0.07 | 32.26 |

In Table VII, five photovoltaic modules have the same 300 W output. However, five others generate just 72 W. Those PV modules are operated at 24V and 3 A to be at the maximum power point. The system output voltage $V_{OUT}$ is 200V. Thus, the system output current is 9.3 A. Five DC power optimizers may operate in buck mode to reduce the DC voltage from 24V to 7.742V. One theoretical solution is for the other five DC power optimizers to operate in boost mode to increase the DC voltage from the PV module from 30V to 32.26V. However, note that in this example, the DC optimizers are buck optimizers. Thus, boost mode is not an option.

One possible solution is to shut down the entire system, with the loss of all generated power. Another possible solution is to operate DC power optimizers 202(6)-202(10) in buck mode with a 100 percent duty cycle. However, this will reduce the power output, as several solar modules will not be operated at a maximum power point. Also, the total voltage $V_{OUT}$ might need to be reduced far below 200V. Thus, it could be difficult for the solar inverter to operate properly.

TABLE VIII

| PV | $I_{PV}$ | $V_{PV}$ | $P_{PV}$ | $P_{PVT}$ | $V_{OUT}$ | $I_{OUT}$ | Mode | Duty | $V_{PO}$ |
|---|---|---|---|---|---|---|---|---|---|
| 1 | 3 | 24 | 72 | 948 | 200 | 4.74 | Buck | 0.63 | 15.19 |
| 2 | 3 | 24 | 72 | | | 4.74 | Buck | 0.63 | 15.19 |
| 3 | 3 | 24 | 72 | | | 4.74 | Buck | 0.63 | 15.19 |
| 4 | 3 | 24 | 72 | | | 4.74 | Buck | 0.63 | 15.19 |
| 5 | 3 | 24 | 72 | | | 4.74 | Buck | 0.63 | 15.19 |
| 6 | 3 | 24 | 72 | | | 4.74 | Buck | 0.63 | 15.19 |
| 7 | 3 | 24 | 72 | | | 4.74 | Buck | 0.63 | 15.19 |
| 8 | 3 | 24 | 72 | | | 4.74 | Buck | 0.63 | 15.19 |
| 9 | 3 | 24 | 72 | | | 4.74 | Buck | 0.63 | 15.19 |
| 10 | 10 | 30 | 300 | | | 4.74 | Boost | 0.53 | 63.29 |

In Table VIII, one photovoltaic modules has 300 W output. However, nine others generate just 72 W. Those nine PV modules are operated at 24V and 3 A to be at the maximum power point of 72 W. The system output voltage $V_{OUT}$ is 200V. Thus, the system output current is 4.74 A. Nine DC power optimizers may operate in buck mode to decrease the DC voltage from 24V to 15.19V. One theoretical solution is for one DC power optimizer 202(10) to operate in boost mode to increase the DC voltage from its PV module 102(10) from 30V to 63.29V. A problem with this solution is the high voltage required on the output of the DC power optimizer 202(10) in boost mode. Note that there may be an output capacitor in DC power optimizer 202(10) that is put under severe strain. Another problem is that it requires a more complex solution to have a buck-boost convertor, as opposed to a buck convertor. Thus, the situation in Table VIII suffers from problems already discussed with respect to Tables III, IV, and VII.

Embodiments disclosed herein reduce or eliminate the need to shut down the system in response to a high output voltage of the DC power optimizers. Embodiments disclosed herein reduce or eliminate the need to limit the output voltage of DC power optimizers. Hence, embodiments provide for efficient operation of photovoltaic modules. Hence, embodiments provide a stable and adequate voltage to a solar inverter.

Figure 3A:
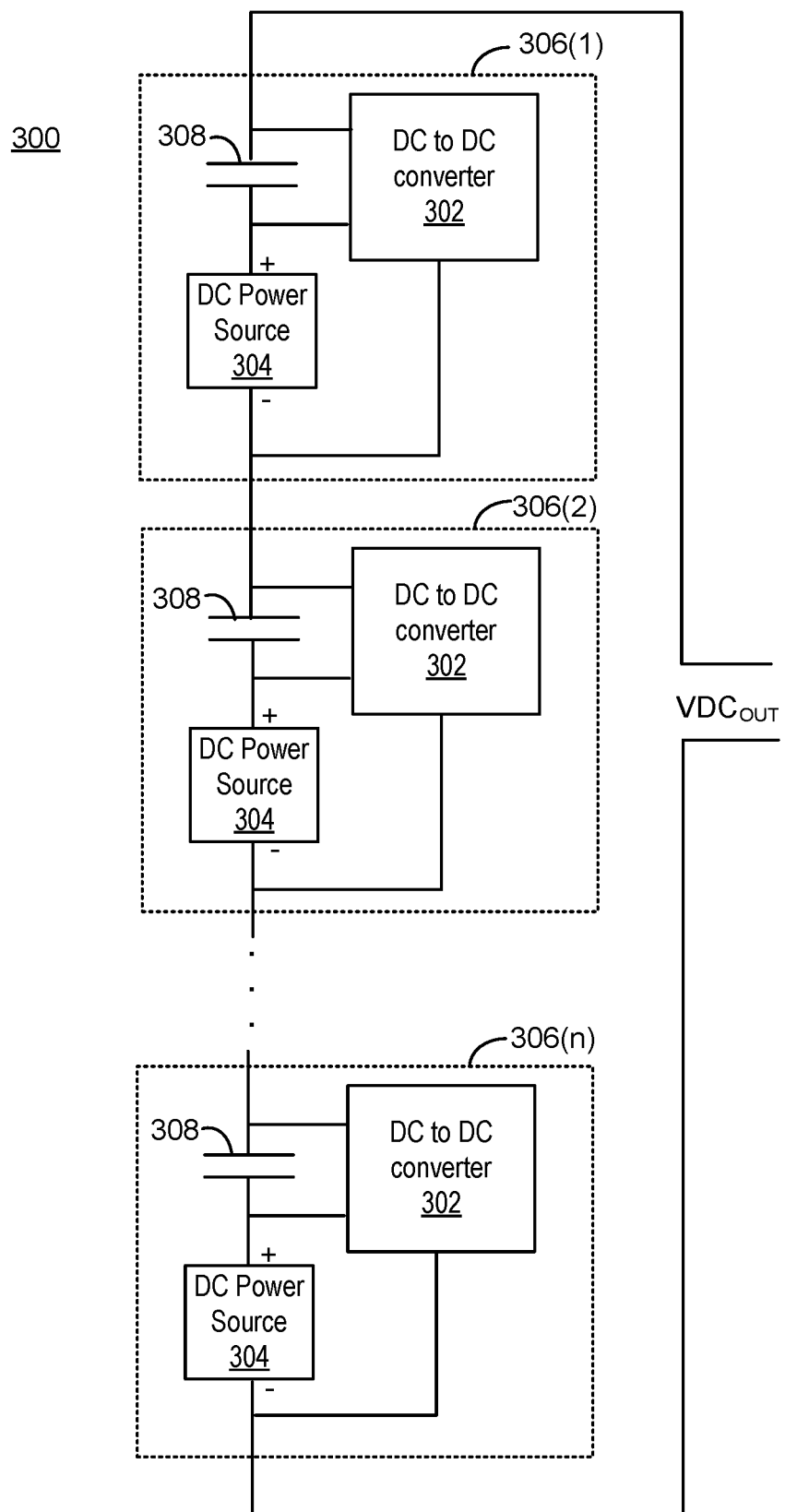
FIG. 3A is a diagram of one embodiment of a series stacked system for converting power from DC power sources.

FIG. 3A is a diagram of one embodiment of a series stacked system 300 for converting power from DC power sources. The series stacked system 300 has a number of power units 306(1)-306(n). The power units 306 are electrically connected in series. Each power unit 306 has a DC power source 304, a DC to DC converter 302, and a capacitor 308. The capacitor 308 could be considered to be an output capacitor of the DC to DC converter 302. Each DC power source 304 has a DC output, which is represented by the "+" terminal and the "−" terminal. The DC output of the DC power source is connected to an input of the DC to DC converter 302. The DC power optimizers 302 may also be referred to as DC to DC converters.

The DC power sources 304 are connected in series electrically with the capacitors 308. In one embodiment each of the capacitors 308 is the output capacitor of a DC to DC converter 302. Thus, each DC power source 304 is associated with one output capacitor 308, in one embodiment. The system 300 has a DC voltage output ($VDC_{OUT}$) that is taken across the series combination of the DC power sources 304 and capacitors 308.

In some embodiments, each DC to DC converter 302 is configured to regulate the power output of the DC power source 304 to which it is connected. The DC to DC converter 302 may be what is commonly referred to as a "power optimizer". A power optimizer may be configured to attempt to operate a DC power source at an optimum power. A power optimizer may perform what is commonly referred to as "maximum power point tracking" (MPPT), which attempts to operate the DC power source (e.g., photovoltaic module) at a maximum possible power output. Due to real-world limitations, it is rarely possible to maintain a maximum possible power output. Thus, it is understood that a power optimizer is not required to maintain the DC power source at a maximum possible power level at all times, or even most of the time.

Figure 3B:
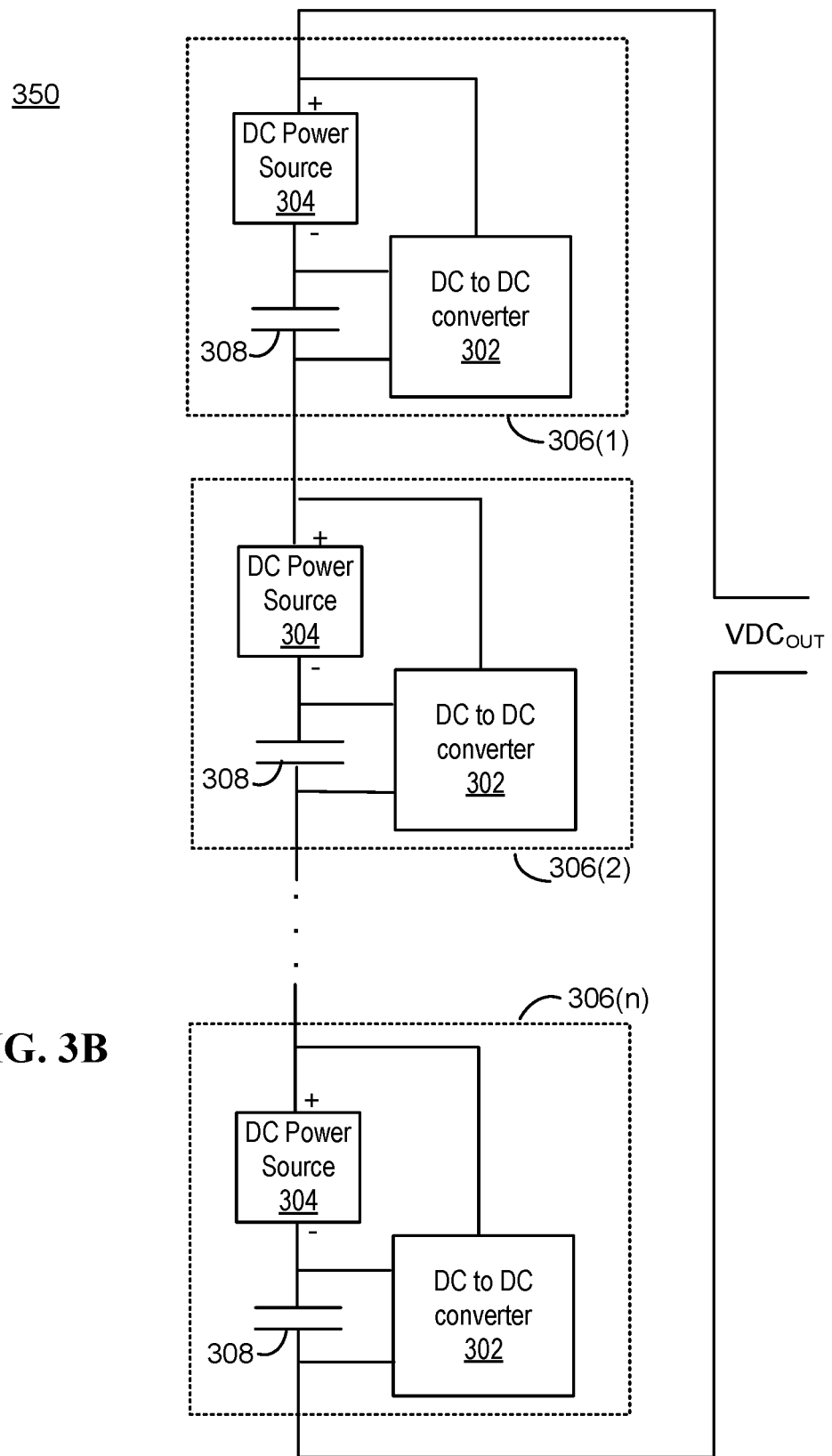
FIG. 3B is a diagram of one embodiment of a series stacked system for converting power from DC power sources.

FIG. 3B is a diagram of one embodiment of a series stacked system 350 for converting power from DC power sources. The series stacked system 350 is similar to system 300, but has a slightly different configuration. Series stacked system 350 differs from series stacked system 300 in the location of the capacitor 308 relative to the DC power source 304. In series stacked system 300, the capacitor 308 is connected to the positive terminal of the DC power source 304. In series stacked system 350, the capacitor 308 is connected to the negative terminal of the DC power source 304. The DC output voltage $VDC_{OUT}$ is taken across the series combination of the DC power sources 304 and capacitors 308.

In one embodiment, the DC power sources 304 in series stacked system 300 are PV modules. In one embodiment, the DC power sources 304 in series stacked system 350 are PV modules. In either case, the DC to DC converter 302 may be used to regulate the power output of the PV modules. For example, the DC to DC converter 302 may operate the respective PV modules at a maximum power point. In one embodiment, the DC power sources 304 in series stacked system 300 are DC batteries. In one embodiment, the DC power sources 304 in series stacked system 350 are DC batteries.

Figure 4A:
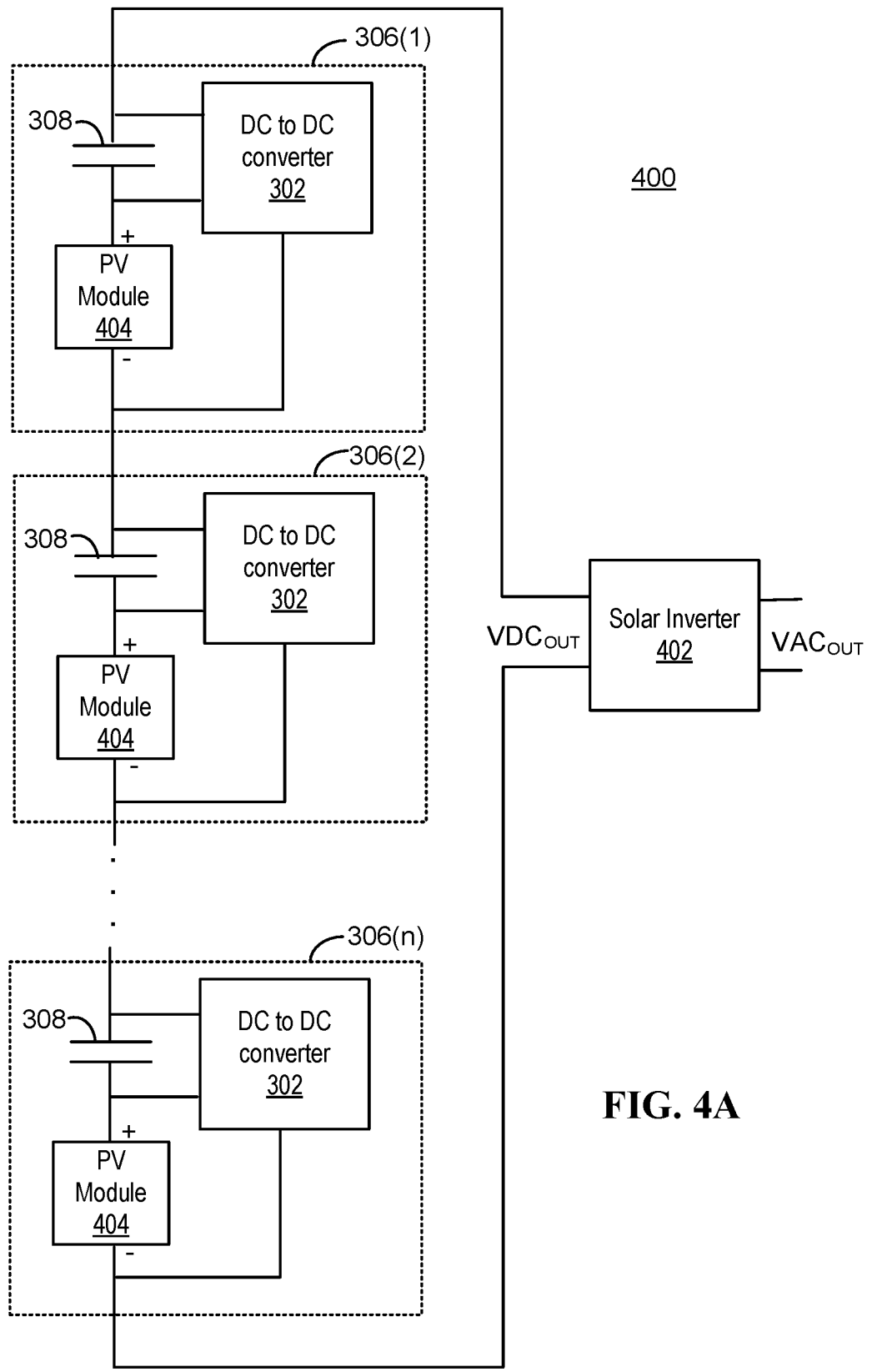
FIG. 4A is a diagram of one embodiment of a series stacked system for converting power from PV modules.

FIG. 4A is a diagram of one embodiment of a series stacked system 400 for converting power from PV modules 404. The system 400 has a number of PV modules 404 connected in series electrically with capacitors 308. Each PV module 404 is associated with a DC to DC converter 302. In one embodiment each of the capacitors 308 is the output capacitor of a DC to DC converter 302. The solar inverter 402 converts DC voltage to an AC voltage ($VAC_{OUT}$). The DC voltage ($VDC_{OUT}$) at the input of the solar inverter 402 is taken across the series combination of the PV modules 404 and capacitors 308. In one embodiment, the solar inverter 402 is configured to attempt to hold its input voltage at a target voltage.

Figure 4B:
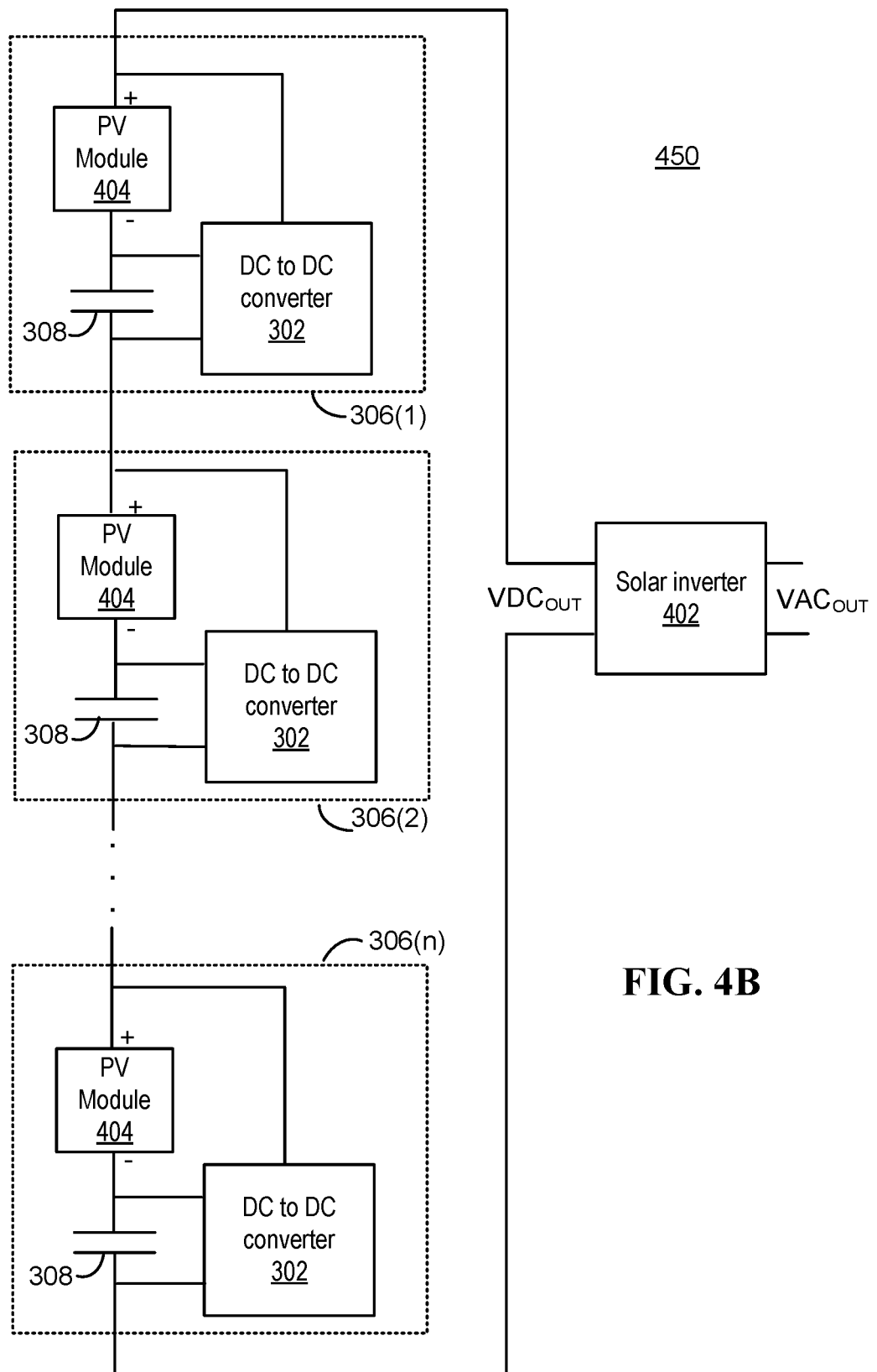
FIG. 4B is a diagram of one embodiment of a series stacked system for converting power from PV modules.

FIG. 4B is a diagram of one embodiment of a series stacked system 450 for converting power from PV modules 404. The series stacked system 450 is similar to system 400, but has a slightly different configuration. In series stacked system 400, the capacitor 308 is connected to the positive terminal of the PV module 404. In series stacked system 450, the capacitor 308 is connected to the negative terminal of the PV module 404.

Figure 5A:
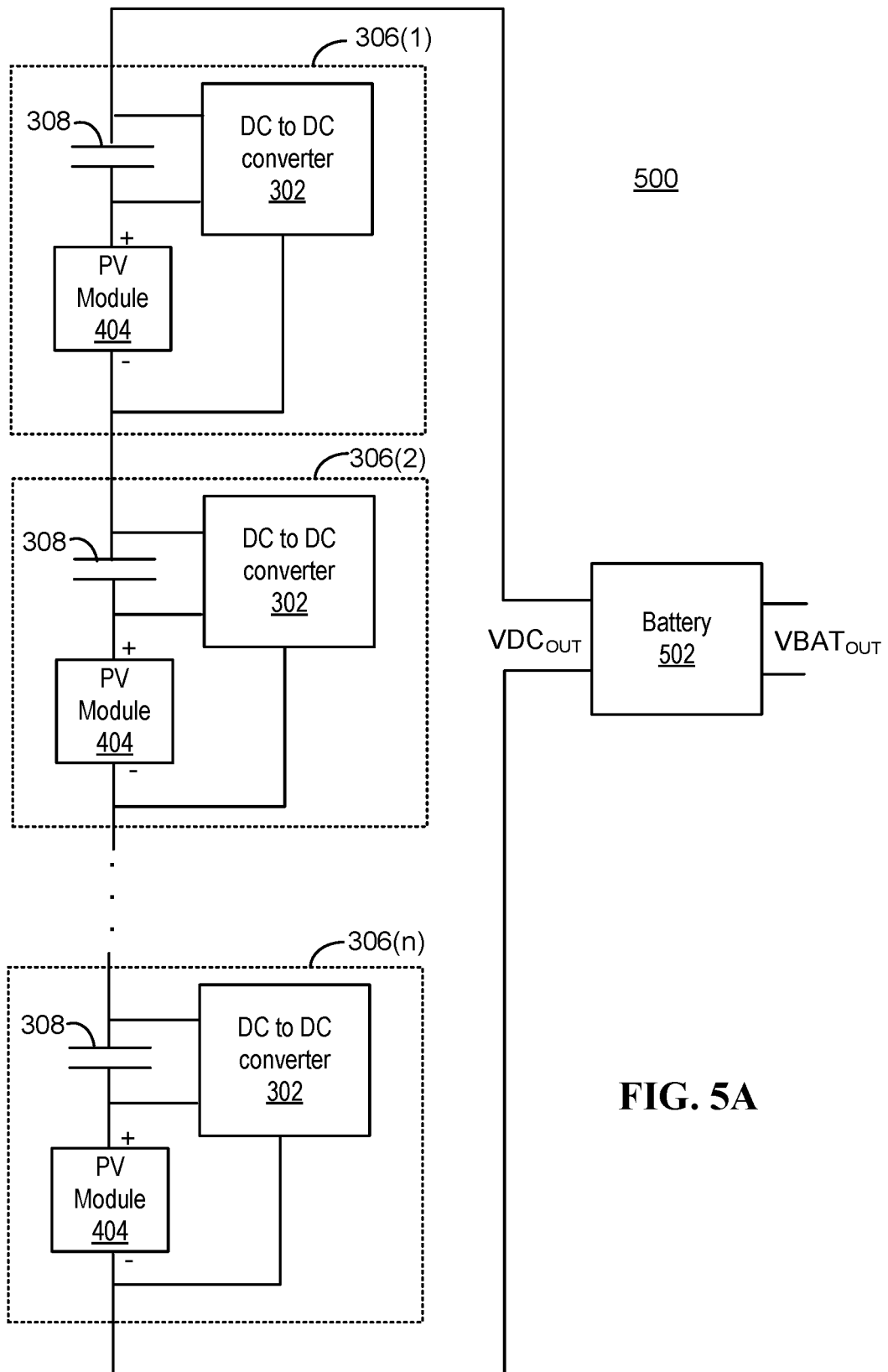
FIG. 5A is a diagram of one embodiment of a series stacked system for converting power from PV modules and storing into a battery.

FIG. 5A is a diagram of one embodiment of a series stacked system 500 for converting power from PV modules 404 and storing into a battery 502. The configuration of series stacked system 500 is similar to series stacked system 400, but with a battery 502 in place of the solar inverter 402. Series stacked system 500 has a number of PV modules 404 connected in series electrically with capacitors 308. Each PV module 404 is associated with a DC to DC converter 302. In one embodiment each of the capacitors 308 is the output capacitor of a DC to DC converter 302. The battery 502 may be used to store the power output of the PV modules 404. The battery 502 has two terminals that are connected across the series combination of the PV modules 404 and capacitors 308.

Figure 5B:
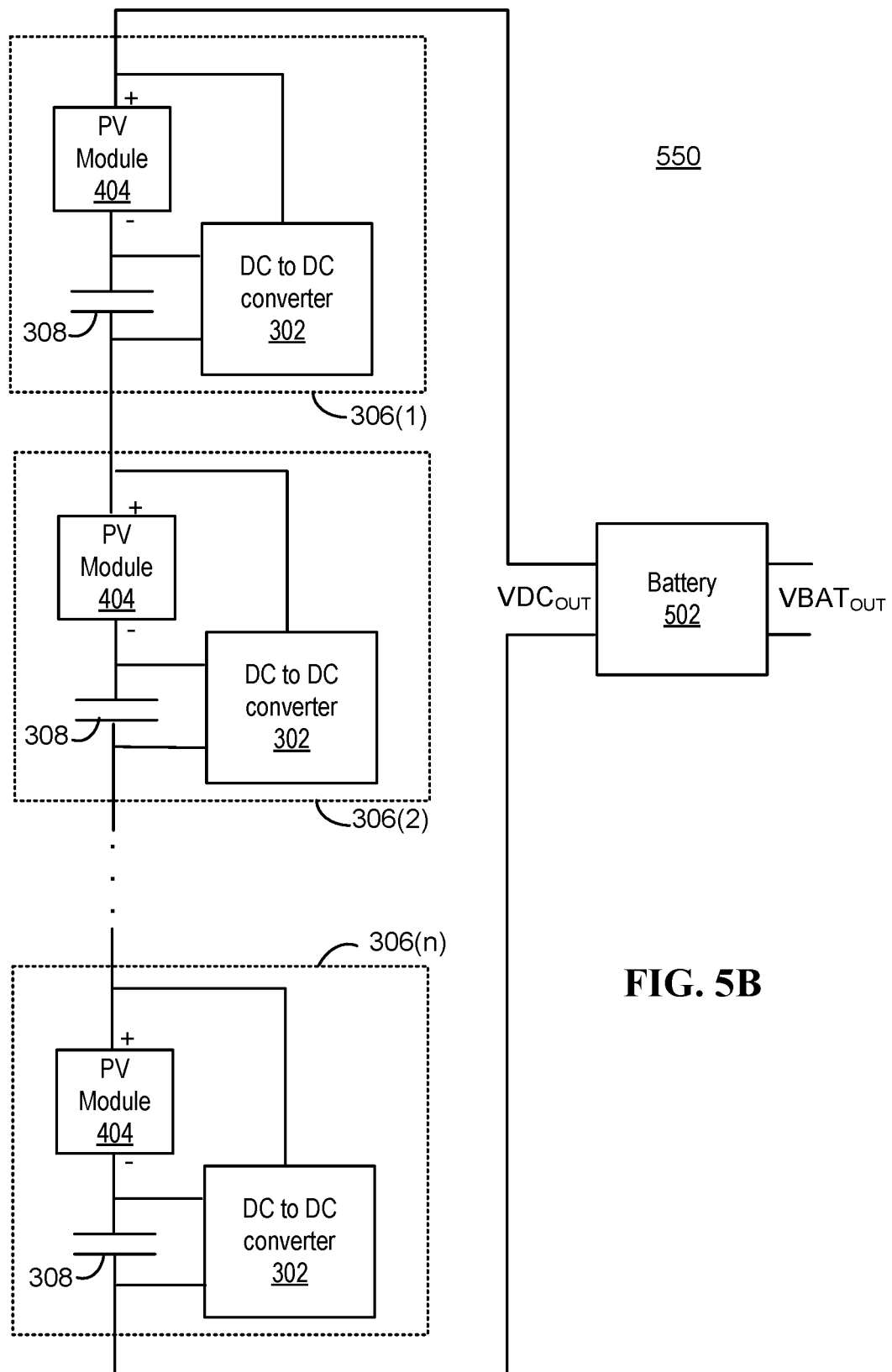
FIG. 5B is a diagram of one embodiment of a series stacked system for converting power from PV modules and storing into a battery.

FIG. 5B is a diagram of one embodiment of a series stacked system 550 for converting power from PV modules 404 and storing into a battery 502. The configuration of system 550 is similar to series stacked system 500. However, the negative terminal of the PV module 404 is connected to the capacitor 308 in the power unit 306.

A wide variety of DC to DC converters can be used for the DC to DC converters 302 in FIGS. 3A-5B. Examples include, but are not limited to, buck, boost, buck/boost, negative buck-boost, Cuk, Sepic, and isolated converters.

Figure 6A:
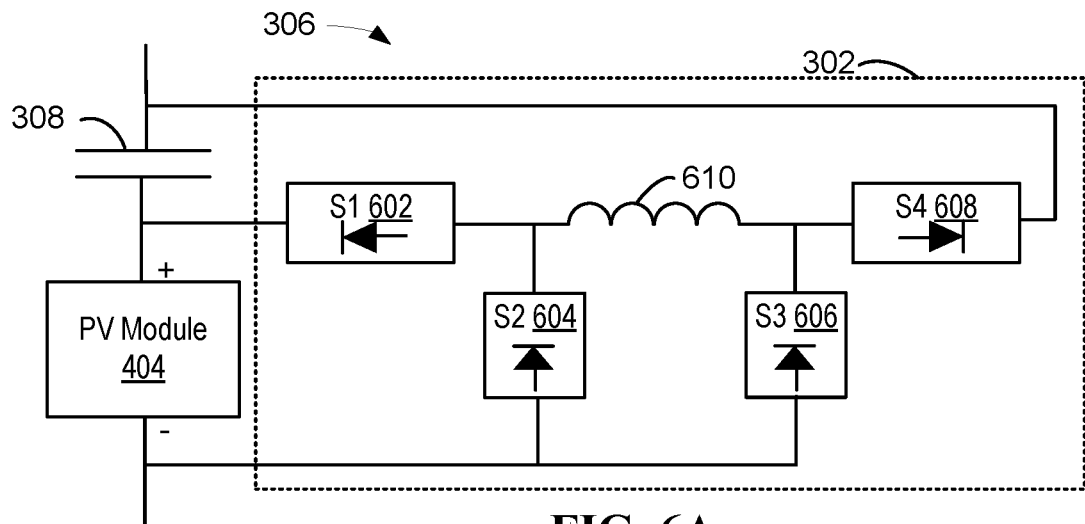
FIG. 6A is one embodiment of a power unit, which may be used in a series stacked system.

FIGS. 6A-9 depict some circuit details of various embodiments of a DC to DC converter 302. Note that embodiments of the DC to DC converters may be power optimizers. FIG. 6A is one embodiment of a power unit 306 having a DC to DC converter 302, output capacitor 308, and PV module 404. A number of these power units 306 can be connected together to form a structure depicted in FIG. 4A (with a solar inverter 402). A number of these power units 306 can be connected together to form a structure depicted in FIG. 5A (with a battery 502).

The output capacitor 308 in the power unit 306 is connected in electrical series with a PV module 404. Note that the output capacitor 308 could be considered to be a part of the DC to DC converter 302. In this embodiment, the DC to DC converter 302 is a buck-boost converter. The DC to DC converter 302 has an inductor 610 and four switches (S1 602, S2 604, S3 606, S4 608). In one embodiment, the switches 602-608 are implemented with transistors. Some of the switches can be implemented with diodes. Optional diodes are depicted in the switches to show the diode direction, in the event a diode is used. Some switches can be implemented with a diode in parallel with a transistor.

Operation of the embodiments of the circuit of FIG. 6A is described in connection with the circuits of FIGS. 6B and 6C.

Figure 6B:
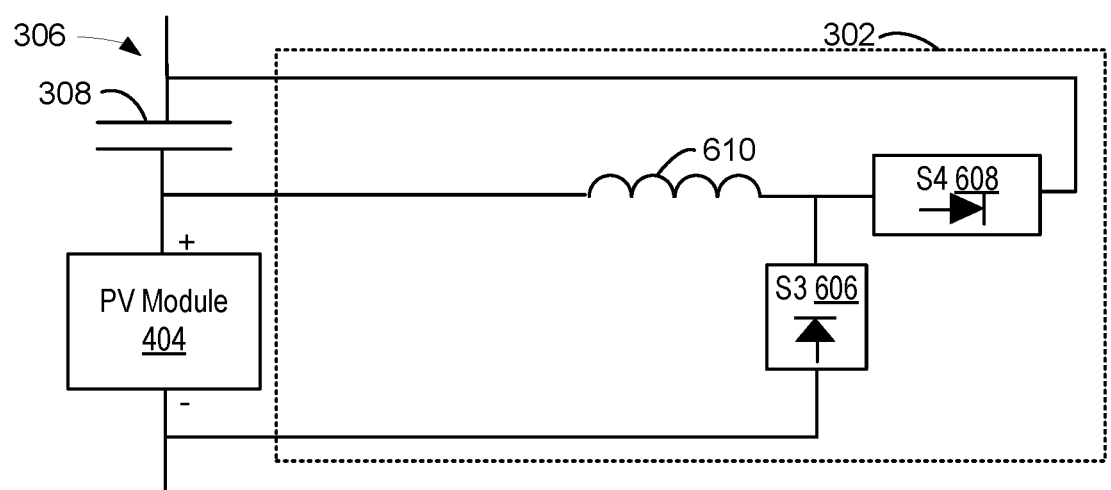
FIG. 6B depicts one embodiment of power unit in which the DC to DC converter may be operated in a boost mode.

FIG. 6B depicts one embodiment of power unit 306 in which the DC to DC converter 302 may be operated in a boost mode. The DC to DC converter 302 is similar to the one in FIG. 6A, but does not depict S1 602 and S2 604. Note that this corresponds to having S1 602 closed all of the time, and S2 604 open all of the time. In one embodiment, S3 606 is an active switch (e.g., transistor). In one embodiment, in a first phase, S3 606 is turned on to increase current in inductor 610. In the first phase, S4 608 is open in one embodiment. If S4 608 is a diode, current does not flow though the diode in phase 1, in one embodiment. In a second phase energy may be transferred from the inductor 610 to the capacitor 308. In this manner the total voltage across the PV module 404 and capacitor 308 may be increased (boost). In one embodiment, S3 606 is open and S4 608 is closed in the second phase. Thus current may flow from the inductor 610 to charge the capacitor 308. As noted, S4 608 may be a diode to allow this charging current from inductor to capacitor 308. Note that the boost operation described with respect to FIG. 6B may be applied to the circuit of FIG. 6A, when that circuit is operated in a boost mode.

Figure 6C:
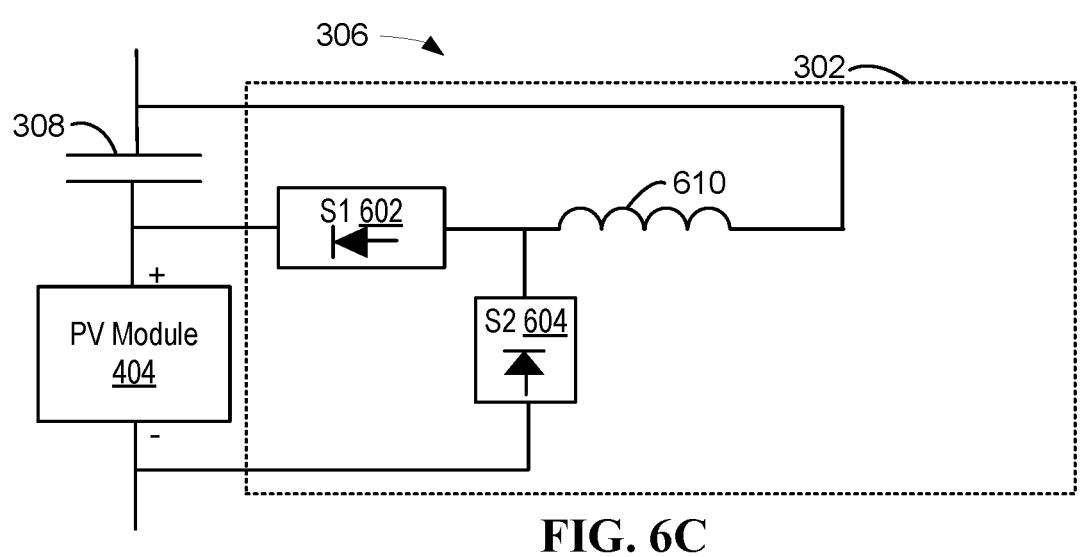
FIG. 6C depicts one embodiment of power unit in which the DC to DC converter may be operated in a buck mode.

FIG. 6C depicts one embodiment of power unit 306 in which the DC to DC converter 302 may be operated in a buck mode. The DC to DC converter 302 is similar to the one in FIG. 6A, but does not depict S3 606 and S4 608. Note that this corresponds to having S4 608 closed all of the time, and S3 606 open all of the time. The switches S1 602, S2 604 can be implemented with transistors. Some of the switches can be implemented with diodes. Some switches can be implemented with a diode in parallel with a transistor. The directions of the diodes in depicted. In one embodiment, switch S1 602 is an active switch (e.g., transistor). In one embodiment, in a first phase, S1 602 is turned on to increase current in inductor 610. In the first phase, S2 604 is open in one embodiment. If S2 604 is a diode, current does not flow though the diode in phase 1, in one embodiment. In one embodiment, S1 602 is open and S2 604 is closed in the second phase. Note that the buck operation described with respect to FIG. 6C may be applied to the circuit of FIG. 6A, when that circuit is operated in a buck mode.

Figure 7:
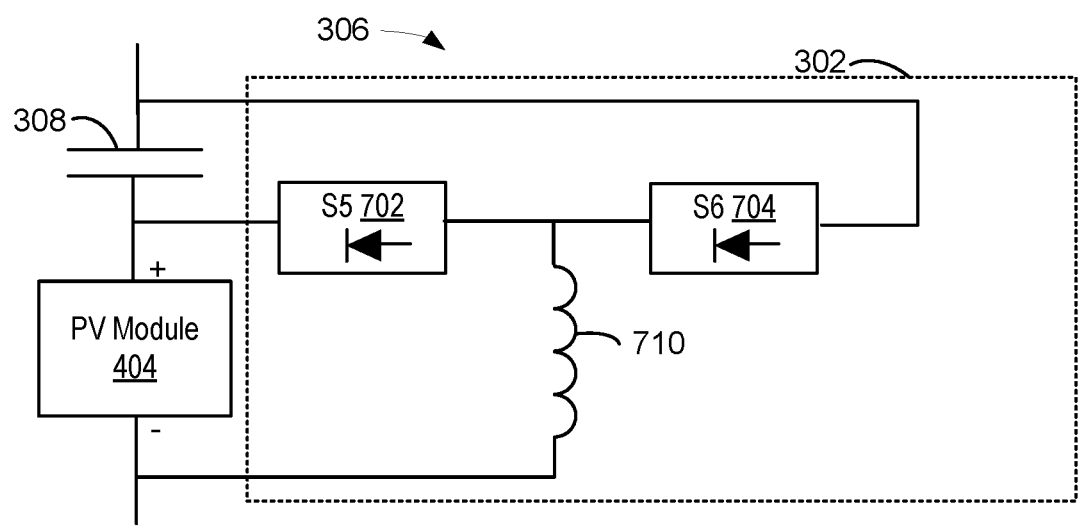
FIG. 7 is one embodiment of a power unit having a DC to DC converter that may be operated in a buck mode.

FIG. 7 is one embodiment of a power unit 306 having a DC to DC converter 302 that may be operated in a buck mode. The output capacitor 308 is connected in electrical series with a PV module 404. A number of these power units 306 can be connected together to form a structure depicted in FIG. 4A or 5A. The DC to DC converter 302 has an inductor 710 and two switches S5 702, S6 704.

The switches 702, 704 can be implemented with transistors. One or more of the switches 702, 704 can be implemented with a diode. In one embodiment, S5 702 is an active switch (e.g., transistor). In one embodiment, in a first phase, S5 702 is turned on to increase current in inductor 710. In the first phase, S6 704 is open in one embodiment. If S6 704 is a diode, current does not flow though the diode in phase 1, in one embodiment. In one embodiment, S5 702 is open and S6 704 is closed in the second phase. The switches 702, 704 can be implemented with a diode in parallel with a transistor. The directions of the diodes, if used, is depicted.

Figure 8A:
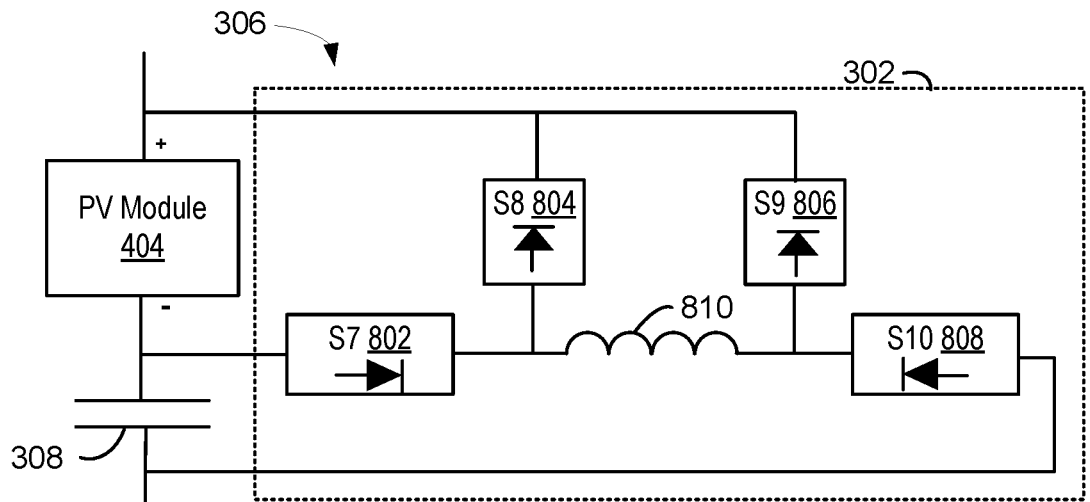
FIG. 8A is one embodiment of a power unit having a DC to DC converter that can be operating in a boost mode and a buck mode.

FIG. 8A is one embodiment of a power unit 306 having a DC to DC converter 302 that can be operating in a boost mode and a buck mode. A number of these power unit 306 can be connected together to form a structure depicted in FIG. 4B (with a solar inverter) or 5B (with a battery). The capacitor 308 may be considered to be an output capacitor of the DC to DC converter 302. The capacitor 308 is connected in electrical series with a PV module 404.

The DC to DC converter 302 in FIG. 8A has an inductor 810 and four switches S7 802, S8 804, S9 806 and S10 808. The switches 802-808 can be implemented with transistors. Some of the switches 802-808 can be implemented with diodes. Some switches can be implemented with a diode in parallel with a transistor. The directions of the diodes, if used, in depicted. Operation of the embodiments of the circuit of FIG. 8A is described in connection with the circuits of FIGS. 8B and 8C.

Figure 8B:
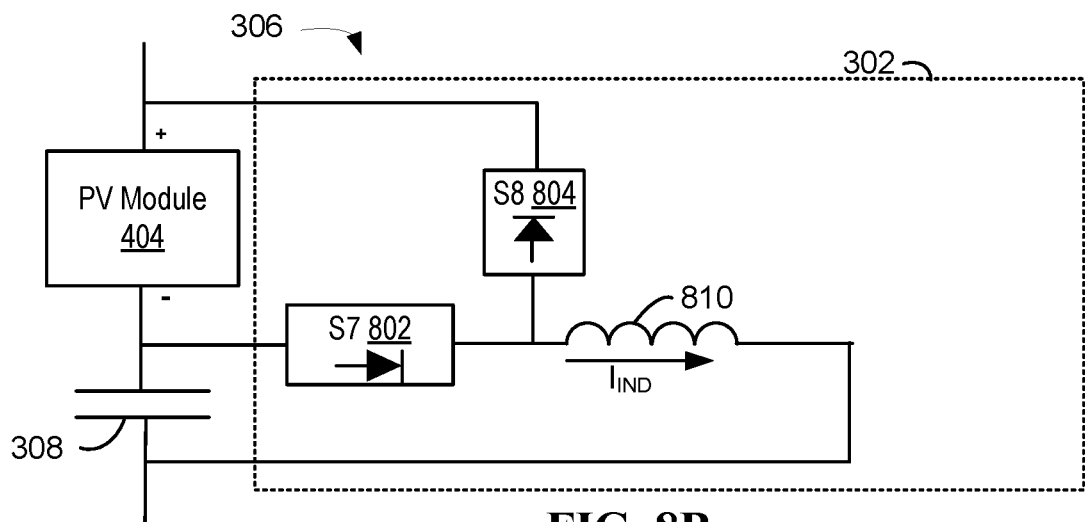
FIG. 8B is one embodiment of a power unit having a DC to DC converter that can be operating in a buck mode.

FIG. 8B is one embodiment of a power unit 306 having a DC to DC converter 302 that can be operating in a buck mode. The DC to DC converter 302 is similar to the one in FIG. 8A, but S9 806 and S10 808 are not depicted. Note that this may be equivalent to having S9 806 open all of the time and S10 808 closed all of the time. A number of these power unit 306 can be connected together to form a structure depicted in FIG. 4B (with a solar inverter). A number of these power unit 306 can be connected together to form a structure depicted in FIG. 5B (with a battery).

In one embodiment, switch S7 802 is an active switch (e.g., transistor). In one embodiment, in a first phase, S7 802 is turned on which increase current in inductor 810. In the first phase, S8 804 may be off (or may be a diode that does not conduct). In a second phase, S7 802 is open and S8 804 is closed (or forward biased diode). The inductor current ($I_{IND}$) may remove charge from the top plate of the capacitor 308, lowering its voltage. Thus, the total voltage across the PV module 404 and capacitor 308 may be reduced. Note that the buck mode operation for the circuit of FIG. 8B may also be applicable to the circuit of FIG. 8A, when operated in buck mode.

Figure 8C:
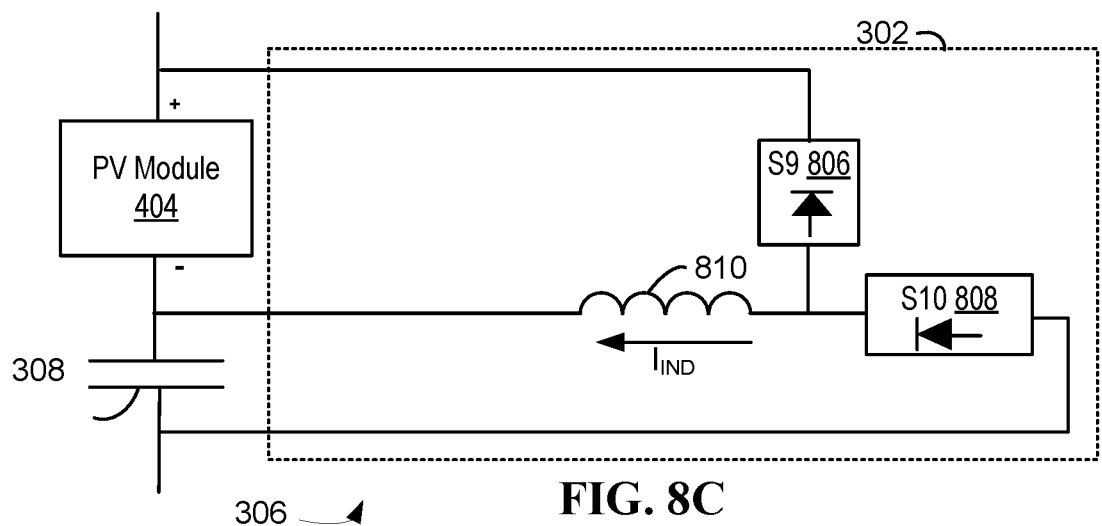
FIG. 8C is one embodiment of a power unit having a DC to DC converter that can be operated in a boost mode.

FIG. 8C is one embodiment of a power unit 306 having a DC to DC converter 302 that can be operated in a boost mode. The DC to DC converter 302 is similar to the one in FIG. 8A, but S7 802 and S8 804 are not depicted. Note that this may be equivalent to having S8 804 open all of the time and S7 802 closed all of the time. A number of these power units 306 can be connected together to form a structure depicted in FIG. 4B (with a solar inverter). A number of these power unit 306 can be connected together to form a structure depicted in FIG. 5B (with a battery).

In one embodiment, switch S9 806 is an active switch (e.g., transistor). In one embodiment, in a first phase, S9 806 is turned on which increase current in inductor 810 in the direction depicted). In the first phase, S10 808 may be off (or may be a diode that does not conduct). In a second phase, S9 806 is open and S10 808 is closed (or forward biased diode). The inductor current ($I_{IND}$) may add charge from the top plate of the capacitor 308, increasing voltage across the capacitor 308. Thus, the total voltage across the PV module 404 and capacitor 308 may be increased (boost). Note that the boost mode operation for the circuit of FIG. 8C may also be applicable to the circuit of FIG. 8A, when operated in buck boost.

Figure 9:
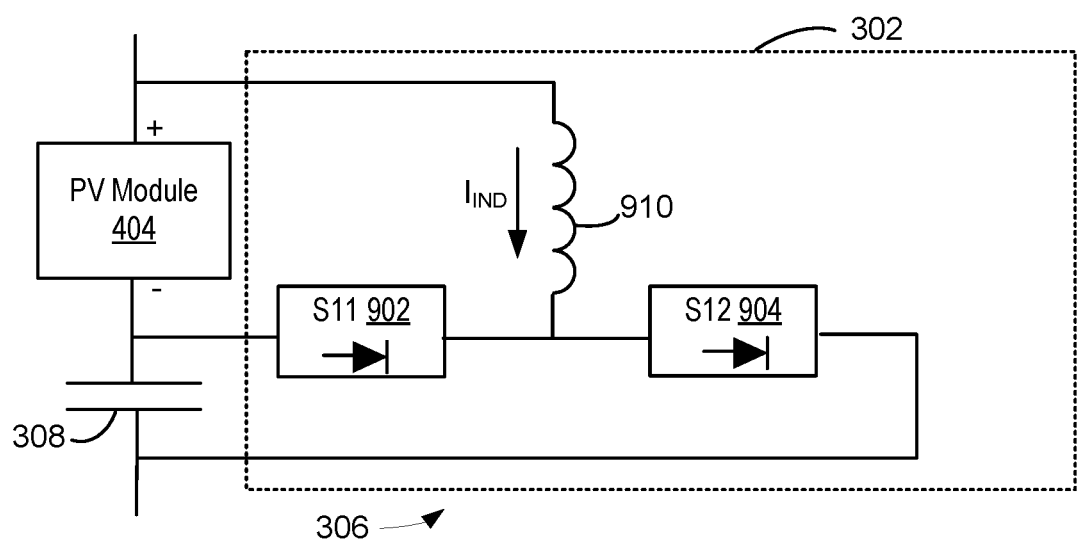
FIG. 9 is one embodiment of a power unit having a DC to DC converter that may be operated in a buck mode.

FIG. 9 is one embodiment of a power unit 306 having a DC to DC converter 302 that may be operated in a buck mode. Output capacitor 308 is connected in electrical series with a PV module 404. A number of these power unit 306 can be connected together to form a structure depicted in FIG. 4B (with a solar inverter). A number of these power unit 306 can be connected together to form a structure depicted in FIG. 5B (with a battery). The DC to DC converter 302 has an inductor 910 and two switches S11 902 and S12 904.

The switches 902, 904 can be implemented with transistors. One or more of the switches 902, 904 can be implemented with diodes. Some switches 902, 904 can be implemented with a diode in parallel with a transistor. The directions of the diodes, if used, is depicted. In one embodiment, switch S11 902 is an active switch (e.g., transistor). In one embodiment, in a first phase, S11 902 is turned on which increases current in inductor 910 in the direction depicted. In the first phase, S12 904 may be off (or may be a diode that does not conduct). In a second phase, S11 902 is open and S12 904 is closed (or forward biased diode). The inductor current $I_{IND}$ may add charge from the top plate of the capacitor 308, increasing voltage across the capacitor 308. Thus, the total voltage across the PV module 404 and capacitor 308 may be increased (boost).

In some embodiments, the switches in the DC to DC converter 302 in FIGS. 6A-9 are controlled in order to regulate the power output of the PV modules 404. For example, the duty cycle of the DC to DC converter 302 may be controlled to attempt to operate its PV module 404 at a maximum power point.

Figure 10A:
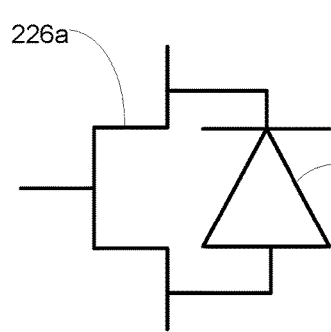
FIGS. 10A-10C depict various embodiments of electrical elements that may be used in the DC to DC converters.
Figure 10B:
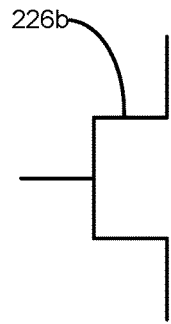
Figure 10C:
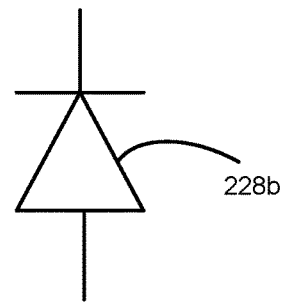

FIGS. 6A-9 depict a number of switches in the DC to DC converters 302. FIGS. 10A-10C depict various embodiments of electrical elements that may be used in the DC to DC converter 302. FIG. 10A is an embodiment in which a switch comprises a transistor 226a and a diode 228a in parallel with the transistor 226a. The transistor 226a may serve as a switch element. The diode 228a may have its anode and cathode arranged as in the diodes in the switches in FIGS. 6A-9. FIG. 10B depicts one embodiment in which each switch comprises a transistor 226b. However, the switch does not include a diode in parallel with transistor 226b. The circuit of FIG. 2C may be used for any of the switches in FIGS. 6A-9. Some of the switches in FIGS. 6A-9 can be replaced by, for example, rectifying elements. FIG. 10C depicts one embodiment of a rectifying element that can be used in place of switches. The rectifying element is a diode 228b in this embodiment. The diode 228b may have its anode and cathode arranged as in the diodes in FIGS. 6A-9.

Figure 11A:
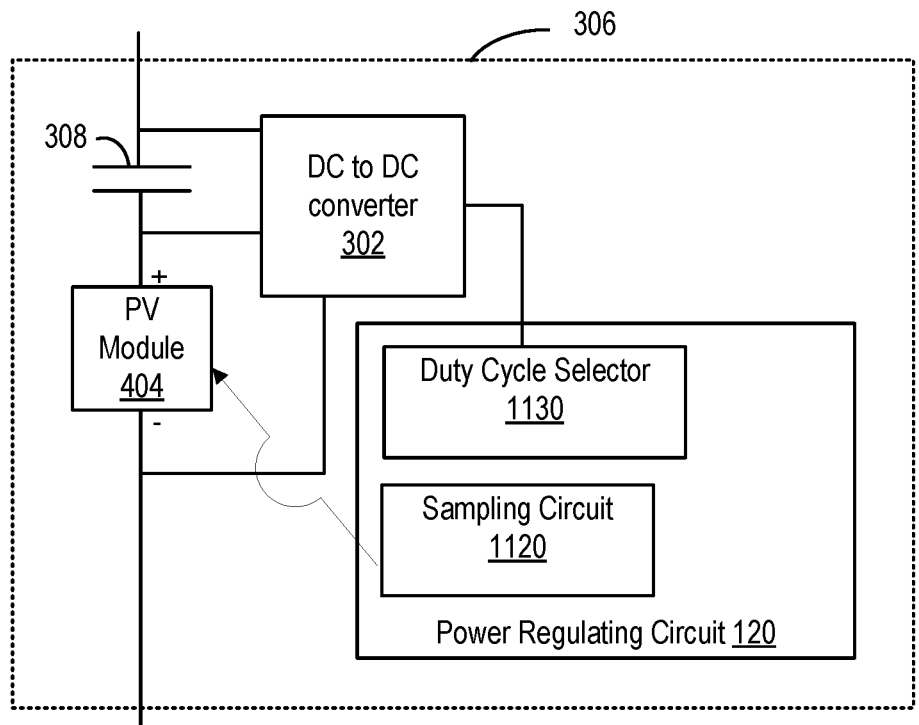
FIG. 11A is a diagram of one embodiment of a power unit having a power regulating circuit.

FIG. 11A is a diagram of one embodiment of a power unit 306 having a power regulating circuit 120. The power unit 306 also has a DC to DC converter 302, PV module 404 and output capacitor 308. The power regulating circuit 120 could be integrated within the DC to DC converter 302. The power unit 306 may be used in the systems of 3A, 4A, or 5A, but is not limited thereto. The location of capacitor 308 relative to PV module 404 can be modified to use in the systems of 3B, 4B, or 5B, but is not limited thereto.

The power regulating circuit 120 has a sampling circuit 1120 and a duty cycle selector 1130. The sampling circuit 1120 is configured to sample a signal (e.g., current and/or voltage) at output of the PV module 404. The duty cycle selector 1130 is configured to select a duty cycle for the DC to DC converter 302. Optionally, the duty cycle selector 1130 could select between a boost mode and a buck mode, in the event that the DC to DC converter 302 can operate in either a boost mode or a buck mode. The distributed power optimizer can have, but is not limited to, any of the configurations in FIG. 6A-9. The power regulating circuit 120 may be implemented by a combination of hardware and/or software. The processing unit 2101 of FIG. 21 (or portions thereof) may be used to implement at least a portion of power regulating circuit 120. In some embodiments, power regulating circuit 120 is implemented with an Application Specific Integrated Circuit (ASIC). The power regulating circuit 120, sampling circuit 1120 and, duty cycle selector 1130 are examples of control logic.

Figure 11B:
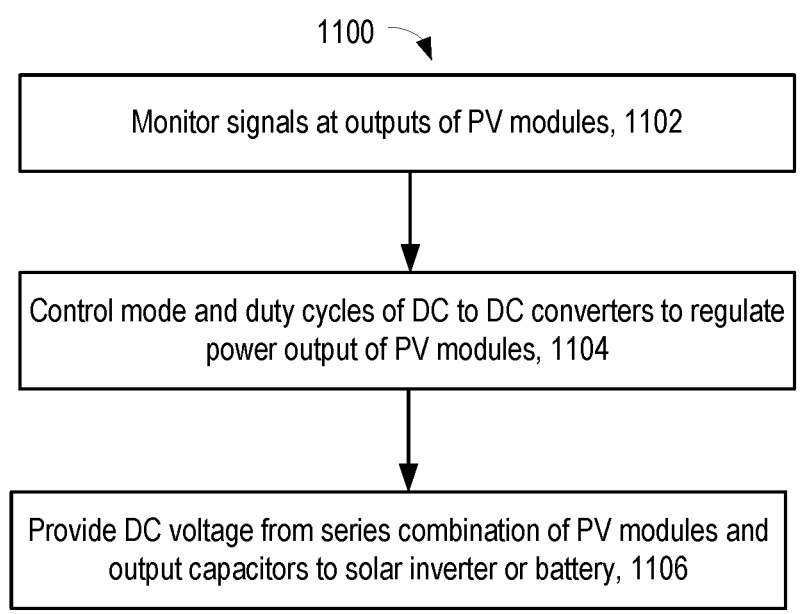
FIG. 11B is a flowchart of one embodiment of a process of operating a series stacked system.

FIG. 11B is a flowchart of one embodiment of a process 1100 of operating a group of DC to DC converters 302 in a series stacked system in which the output capacitors of the series stacked system are connected in series with PV modules 404. The process 1100 will be discussed with reference to the power unit 306 in FIG. 11A, but process 1100 is not limited to that power unit 306. The process 1100 may be used in series stacked system 300, 350, 400, 450, 500, or 550, but is not limited thereto.

Step 1102 includes monitoring a signal at an output of the photovoltaic modules 404. For example, a current and/or a voltage at a DC output of the respective PV modules 404 may be sampled by sampling circuit 1120.

Step 1104 includes controlling a mode and duty cycle of the DC to DC converters 302 to regulate a power output of the PV modules 404. Note that the total voltage across the series combination of PV modules 404 and output capacitors 308 may be connected to the input of a solar inverter 402. The solar inverter 402 might attempt to regulate its input to some preferred voltage. For example, the solar inverter 402 might attempt to regulate its input to 350V. In one embodiment, each DC to DC converter 302 controls the voltage across its output capacitor 308 in order to regulate the output voltage of its PV module 404. Thus, the power output of the PV module 404 can be regulated to meet some criterion.

Process 1100 is not limited to any particular technique to regulate the power outputs of the PV modules 404. In some embodiments steps 1102 and 1104 are used together to attempt to operate each PV module 404 at a maximum power point. As one example, a hill climbing technique may be used in steps 1102-1104. One example of a hill climbing technique is commonly referred to as "perturb and observe". In perturb and observe, the power regulating circuit 120 may adjust the duty cycle slightly and observe the impact on current and voltage (and hence power) output by the corresponding PV module 404. Such adjustments may be made until a maximum power point is located. Since environmental conditions (e.g., solar radiation, operating temperature) may change over time, the power regulating circuit 120 may once again seek a maximum power point at periodic intervals. Many techniques other than perturb and observe may be used. Step 1104 may include duty cycle selector 1130 sending a control signal to the DC to DC converter 302. This control signal may indicate when the various switches in FIGS. 6A-9 are to be opened and closed.

Step 1106 includes providing the DC voltage from the series combination of PV modules 404 and output capacitors 308 to either a solar inverter 402 or a battery 502. In one embodiment, the DC voltage is provided to a solar inverter 402. In one embodiment, the DC voltage is provided to a battery 502.

Note that in process 1100 the solar inverter input voltage (e.g., 350V) (or, alternatively battery 502 input voltage) is across the series combination of the PV modules 404 and the output capacitors 308. This means that relatively little voltage needs to be applied across the output capacitors 308, while still meeting the voltage requirement of the solar inverter 402. Hence, the output capacitors 308 are not stressed as much relative to systems that need to apply high voltages across the output capacitors of DC to DC converters in order to meet voltage requirements of solar inverters.

The embodiments of FIGS. 3A-5B depict one series stack of power units 306. Thus, there is one stack of a series connection of DC power sources (e.g., PV modules) and capacitors (e.g., output capacitors of D to DC converters).

The series stacked systems may have multiple such stacks in parallel. Parallel stacks may be used to increase the output current.

Figure 11C:
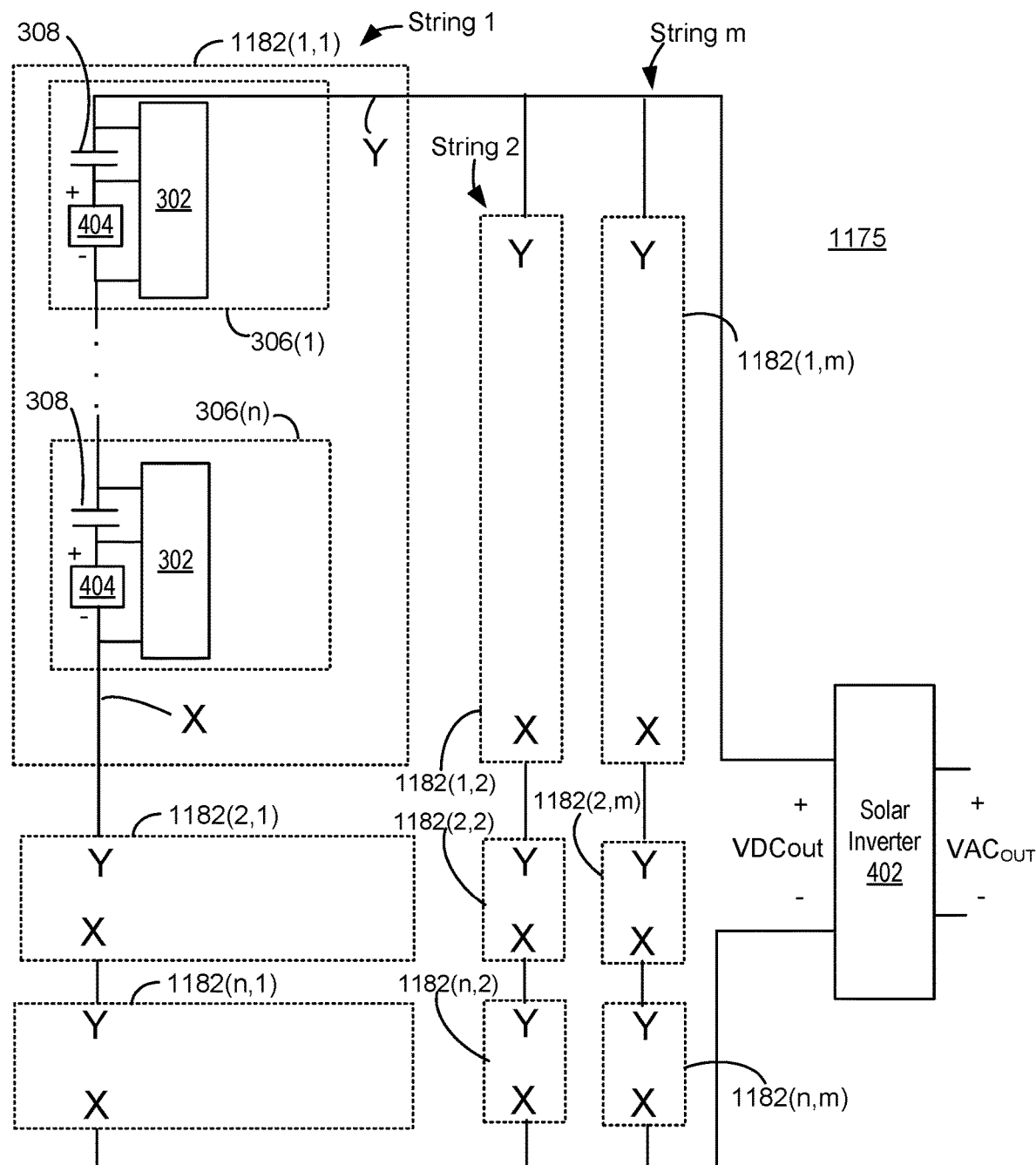
FIG. 11C is a diagram of one embodiment of a photovoltaic power transfer system having multiple series stacked systems.

FIG. 11C is a diagram of one embodiment of a photovoltaic power transfer system 1175 having multiple series stacked systems 1182. In this embodiment, the series stacked systems 1182 are connected in series and in parallel. System 1175 has "m" strings (string 1, string 2, string m) of systems 1182. Each string is a series connection of multiple series stacked systems 1182. In general, there may be one or more strings in a photovoltaic power transfer system. Each string has "n" systems 1182, in the embodiment of FIG. 11C. For example, string 1 has systems 1182(1,1), 1182(2,1), 1182(n,1); string 2 has systems 1182(1,2), 1182(2,2), ... 1182(n,2); string 3 has systems 1182(1,m), 1182(2,m), ... 1182(n,m). In general, there may be one or more series stacked systems 1182 in a string in a photovoltaic power transfer system. Having multiple strings provides for parallel connections of series stacked systems 1182.

Some details of one system 1182(1,1) are depicted. In this example, series stacked system 1182(1,1) is similar to series stacked system 400 in FIG. 4A. Alternatively, series stacked systems based on, but not limited to, series stacked systems 300, 350, 450, 500 or 550 might be used.

For reference, several nodes in series stacked system 1182(1,1) are depicted. Node Y refers to the positive output of the DC to DC converter 302. Node X refers to the negative output of the DC to DC converter 302.

In photovoltaic power transfer system 1175, node Y of the top photovoltaic power transfer system 1175 on each string is connected to the positive input of the solar inverter 402. In photovoltaic power transfer system 1175, node X of the bottom series stacked system 1182 on each string is connected to the negative input of the solar inverter 402. Note that in another embodiment, the solar inverter 402 is replaced by a battery 502.

In photovoltaic power transfer system 1175, node X of system 1182(1,1) is connected to Node Y of system 1182(2,1). Similar connections are depicted for other pairs of series stacked systems 1182.

In this configuration, the input terminals of the solar inverter 402 are connected across the series connection of the PV modules 404 and output capacitors 308 in String 1. Likewise, the input terminals of the solar inverter 402 are connected across the series connection of the PV modules 404 and output capacitors 308 in the other Strings (2 ... m).

Moreover, each string is able to provide its own string current. Thus, String 1 provides a string current, String 2 provides a string current, and String m provides a string current. These three string currents may add up such that the photovoltaic power transfer system 1175 is able to increase the amount of current provided to the solar inverter 402.

Figure 12:
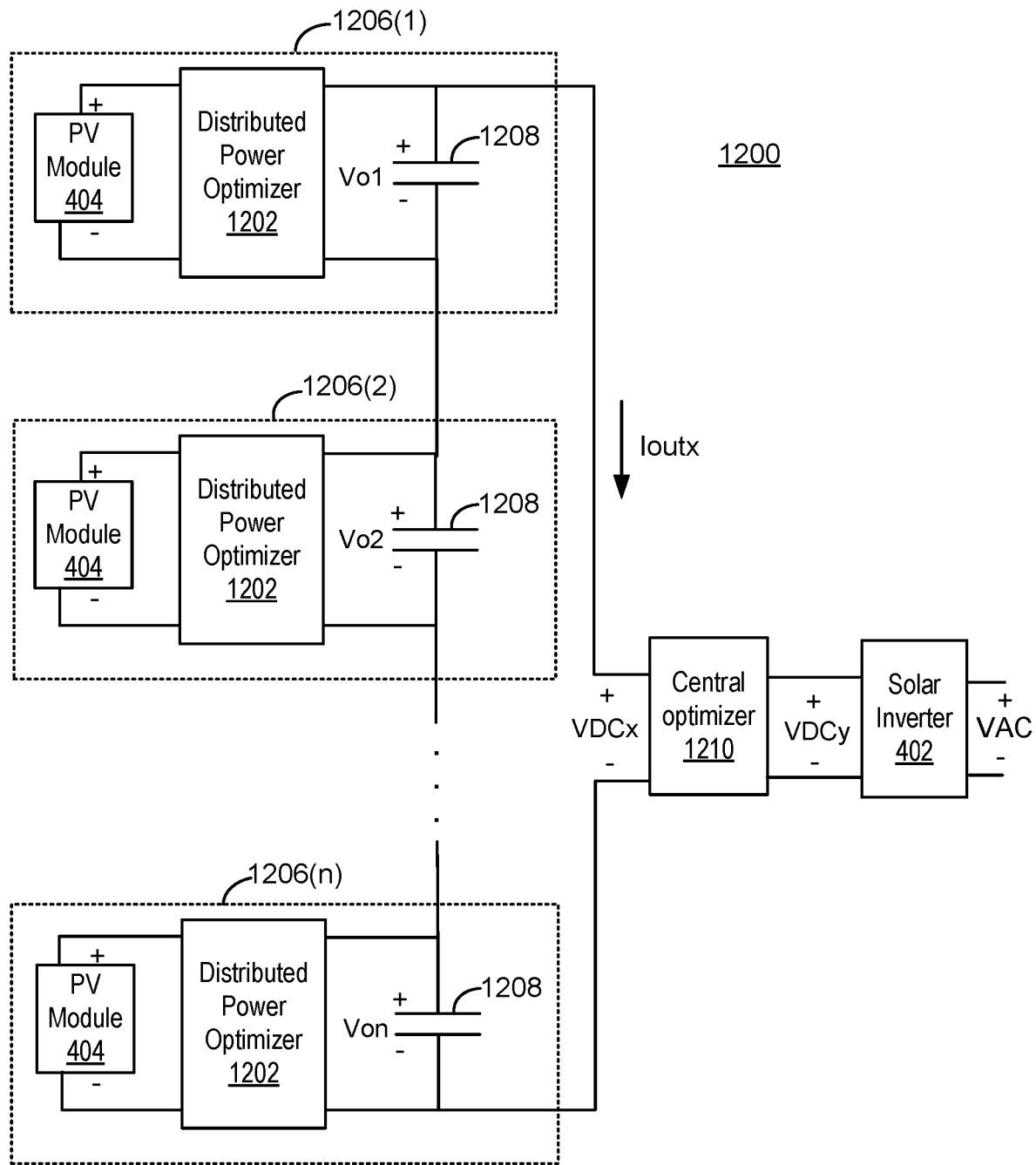
FIG. 12 is a diagram of one embodiment of distributed/central optimizer system having a central optimizer.

FIG. 12 is a diagram of one embodiment of distributed/central optimizer system 1200 having a set of distributed optimizers 1202 and a central optimizer 1210. The central optimizer 1210 (and others disclosed herein) may comprise a DC to DC converter. The system 1200 is able to adaptively optimize for shading of PV modules 404, in one embodiment. The distributed/central optimizer system 1200 has a number of power modules 1206(1)-1206(n). Each of the power modules 1206 has a photovoltaic (PV) module 404, each with a DC output voltage. Each PV module 404 is associated with a distributed power optimizer 1202 (which may include a DC to DC converter). The distributed power optimizers 1202 might be buck-boost converters, buck converters, boost converters, but are not limited thereto.

Each distributed power optimizer 1202 has an output capacitor 1208. The combined voltages (e.g., Vo_1+Vo_2+ Vo_n) across the output capacitors 1208 is referred to as "VDC_x" and is input to a central optimizer 1210. The central optimizer 1210 has an output "VDC_y," which is the input to the solar inverter 402. The solar inverter 402 converts the DC input voltage (VDC_y) to an AC voltage (VAC).

The central optimizer 1210 may assist in improving the power output of the PV modules 404, at least indirectly. The central optimizer 1210 may do so by allowing the distributed power optimizers 1210 to operate more effectively. For example, without the central optimizer 1210, a distributed power optimizers 1210 might need to be shut down, or have its output voltage clamped, to protect the distributed power optimizer. It will be understood that the central optimizer 1210 need not perform any tracking of the power output of the PV modules 404, such as maximum power point tracking. Moreover, the operation of the central optimizer 1210 is not required to depend on sampling a condition of any of the PV modules 404.

The central optimizer 1210, in one embodiment, has a DC to DC converter. The central optimizer 1210 has a bypass mode and a boost mode, in one embodiment. In the bypass mode, the central optimizer 1210 is configured to pass its input voltage to its output unchanged. Thus, in the bypass mode VDC_x may be equal in magnitude to VDC_y. In the boost mode, the central optimizer 1210 is configured to boost the voltage on its input. Thus, the central optimizer 1210 is configured to boost VDC_x when in the boost mode. Therefore, when in the boost mode, VDC_y may be greater in magnitude than VDC_x.

In one embodiment, the distributed/central optimizer system 1200 has control logic that is configured to reduce the voltage VDC_x when the central optimizer 1210 is in the boost mode. The central optimizer 1210 may be configured to boost that voltage such that VDC_y has about the same magnitude whether the central optimizer 1210 is in the boost mode or the bypass mode. Therefore, the voltage that the central optimizer 1210 provides to the solar inverter 402 may remain substantially constant.

In one embodiment, the distributed/central optimizer system 1200 switches between the bypass mode and the boost mode responsive to one or more conditions in the distributed/central optimizer system 1200. For example, the distributed/central optimizer system 1200 may determine that for some reason, the distributed power optimizers 1202 (e.g., buck-boost optimizers) are either not able to maintain VDC_x at a target voltage or that attempting to maintain VDC_x at a target voltage would place undue stress on one or more of the distributed power optimizers 1202. Thus, the distributed/central optimizer system 1200 may switch to the boost mode, which can both allow the system to keep VDC_y at a target level while not placing undue stress on the distributed power optimizers 1202. Note that keeping VDC_y at a target level may allow the solar inverter 402 to operate efficiently. Also, keeping VDC_y at a target level may allow the solar inverter 402 to generate the proper AC voltage. For example, the solar inverter 402 may be attempting to generate a suitable AC voltage for an AC power grid.

The central optimizer 1210 may be implemented with a variety of circuits including, but not limited to, a charge pump, boost converter, multi-level boost converter, multiple boost converters in series and/or parallel, isolated DC converters.

Figure 13A:
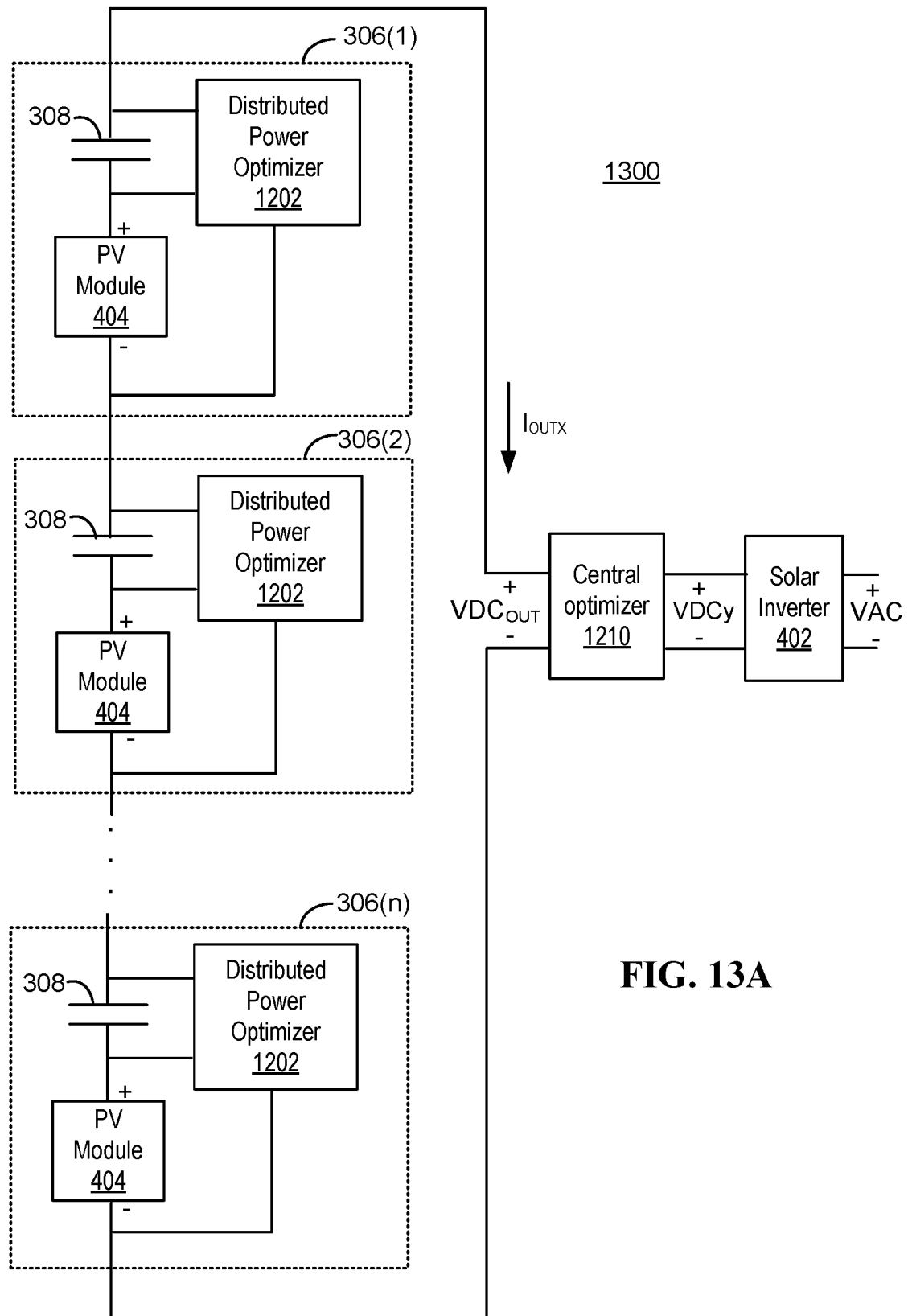
FIG. 13A a diagram of one embodiment of distributed/central optimizer system having a central optimizer.

FIG. 13A a diagram of one embodiment of distributed/central optimizer system 1300 having a central optimizer 1210. The distributed/central optimizer system 1300 is able to adaptively optimize for shading of PV modules 404, in one embodiment. The distributed/central optimizer system 1300 has some elements in common with series stacked system 400 of FIG. 4A, but adds a central optimizer 1210. The input of central optimizer 1210 is across the combined series combination of the PV modules 404 and output capacitors 308.

Figure 13B:
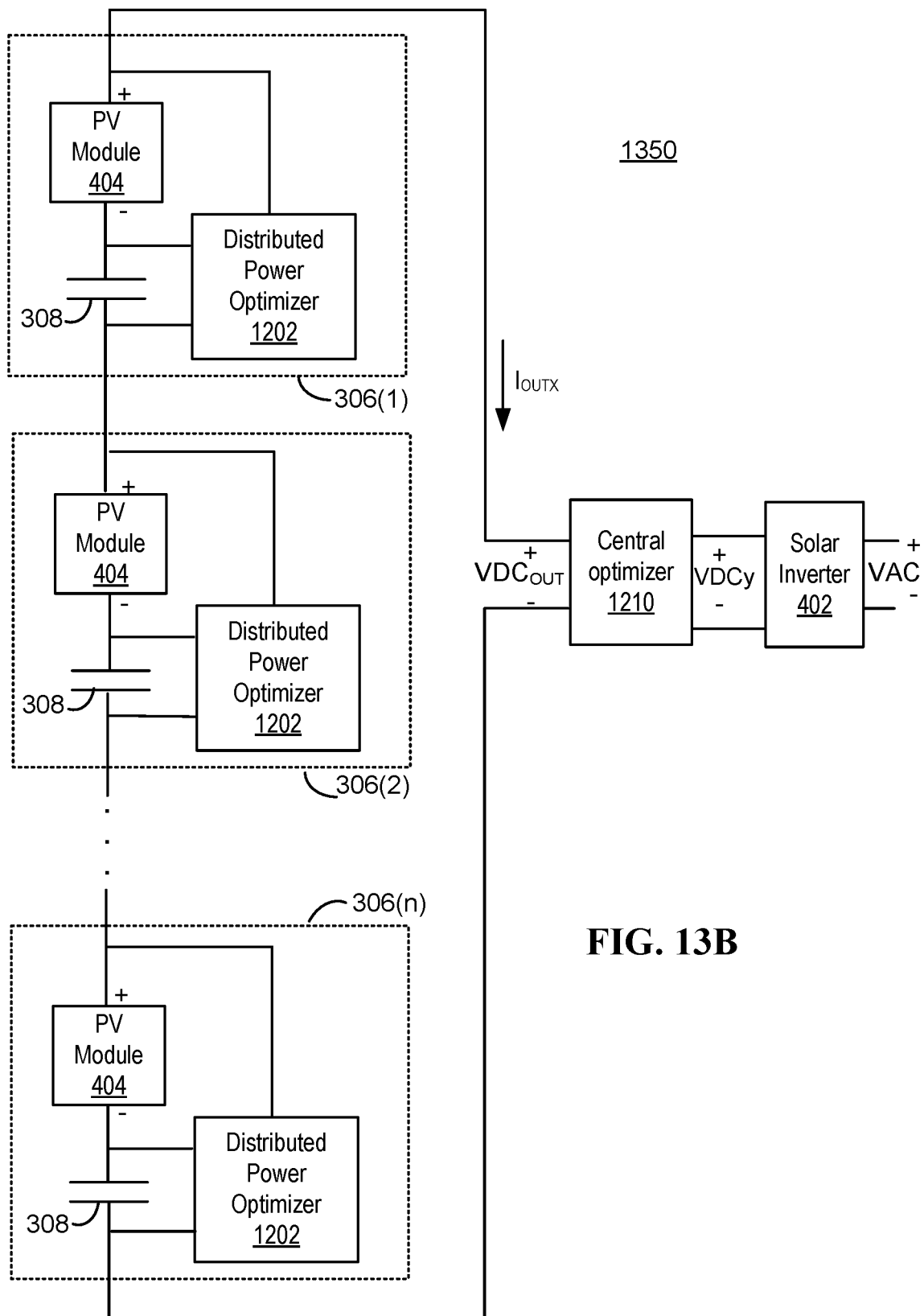
FIG. 13B a diagram of one embodiment of distributed/central optimizer system having a central optimizer.

FIG. 13B a diagram of one embodiment of distributed/central optimizer system 1350 having a central optimizer

1210. The distributed/central optimizer system is able to adaptively optimize for shading of PV modules 404, in one embodiment. The distributed/central optimizer system 1350 is similar to series stacked system 450 of FIG. 4B, but adds a central optimizer 1210. The input of central optimizer 1210 is across the combined series combination of the PV modules 404 and output capacitors 308.

Figure 14:
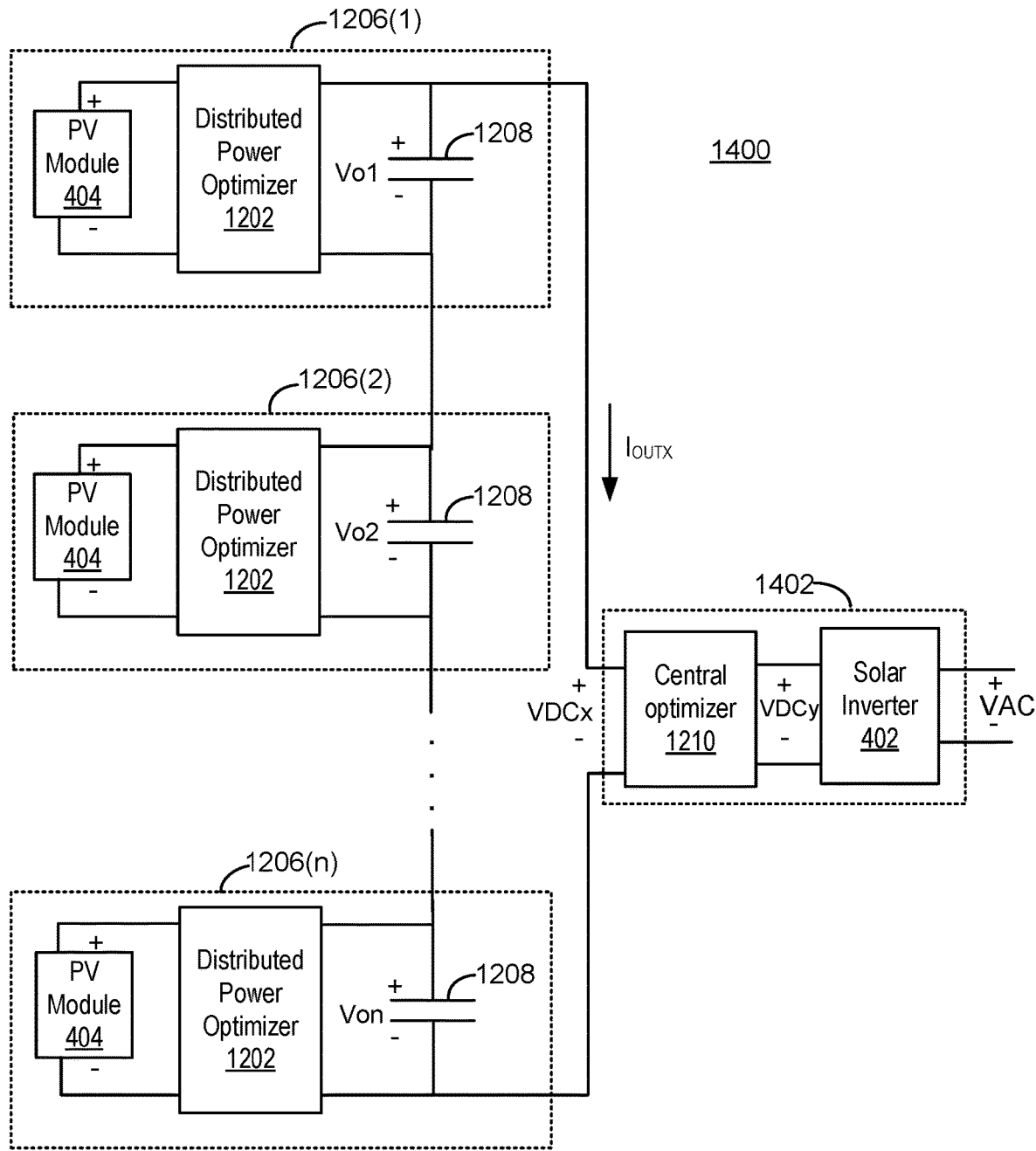
FIG. 14 and FIG. 15 are diagrams of embodiments of distributed/central optimizer systems in which the central optimizer is integrated in different manners into the system.
Figure 15:
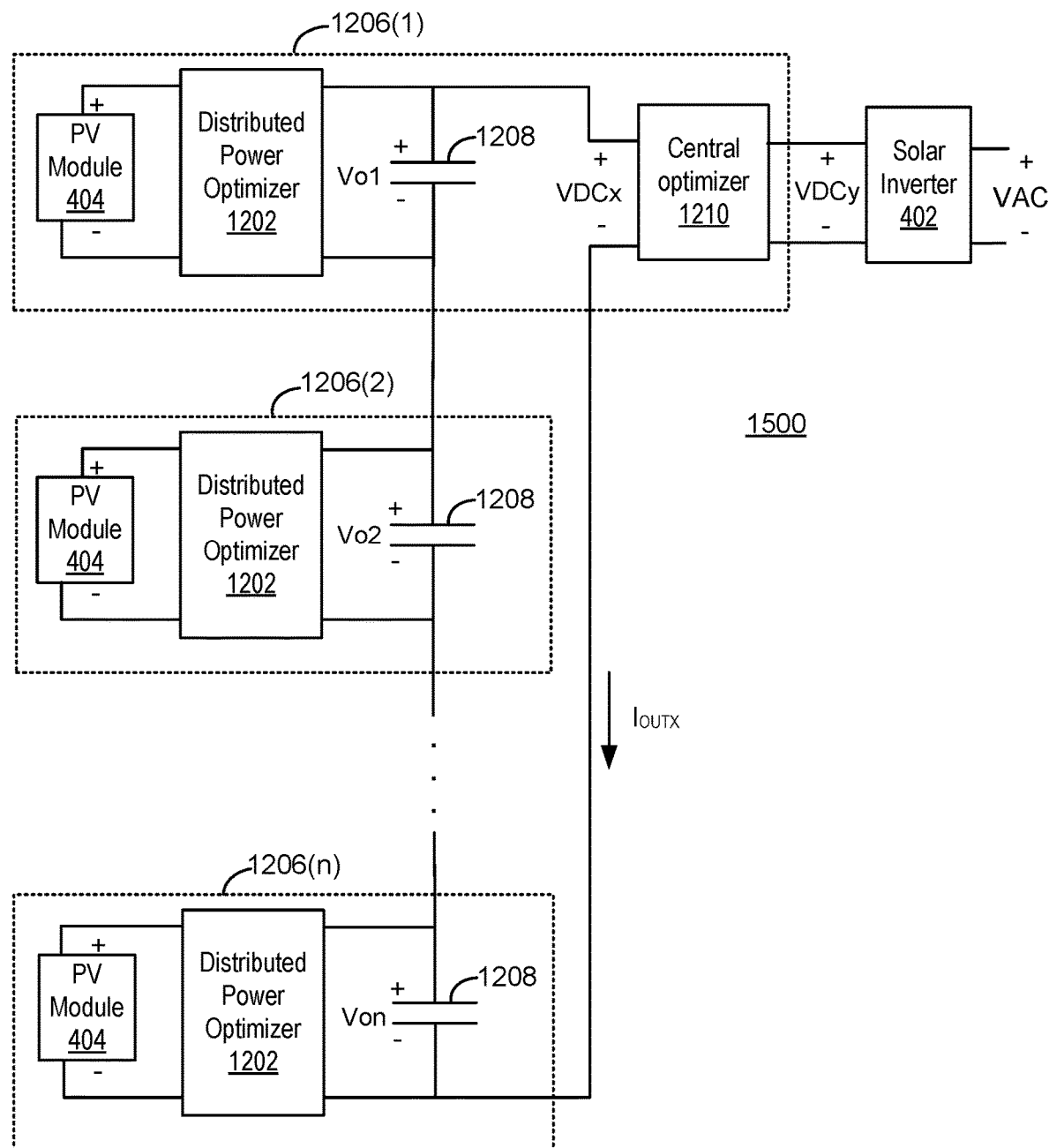

FIGS. 14 and 15 are diagrams of embodiments of distributed/central optimizer systems in which the central optimizer 1210 is integrated in different manners into the system. In distributed/central optimizer system 1400 of FIG. 14, the central optimizer 1210 is physically integrated into the same component 1402 as the solar inverter 402. For example, the central optimizer 1210 and the solar inverter 402 may be contained with the same integrated circuit, the same package, etc.

In distributed/central optimizer system 1500 of FIG. 15, the central optimizer is integrated into the same component as one of the distributed DC optimizers. In system 1500, the central optimizer 1210 and the distributed power optimizer 1202 may be contained with the same integrated circuit, the same box, etc. In this example, the input of the central optimizer 1210 has two terminals. One terminal is connected to an output terminal of distributed power optimizer 1202 in power module 1206(1) and the other terminal is connected to an output terminal of the distributed power optimizer 1202 in power module 1206(n).

Figure 16A:
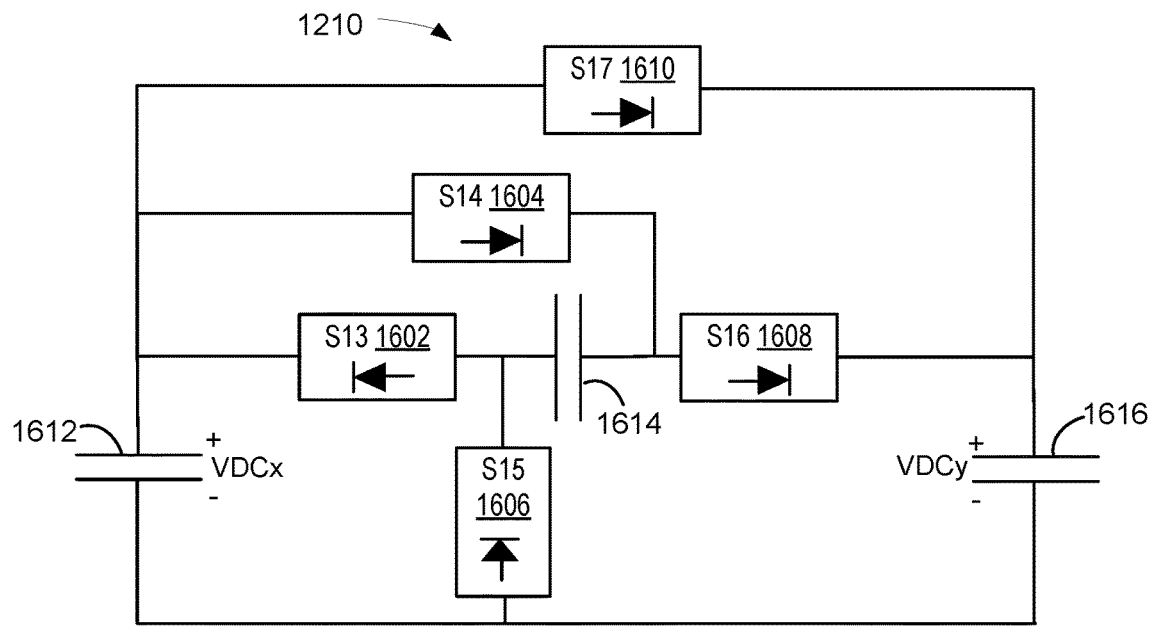
FIGS. 16A and 16B are diagrams of alternative embodiments of a central optimizer.
Figure 16B:
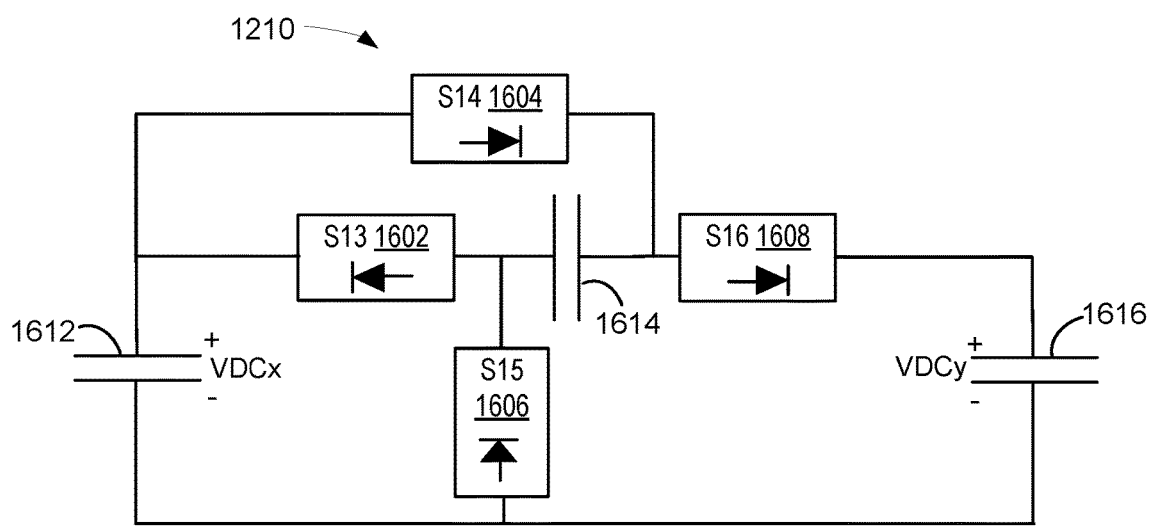

FIGS. 16A and 16B are diagrams of alternative embodiments of at least a portion of a central optimizer 1210. The central optimizers each comprise a charge pump in these embodiments. The two central optimizers are similar, with the one in FIG. 16A having a bypass switch S5 1610. Each central optimizer 1210 has an input capacitor 1612, with VDC_x across its plates. Each central optimizer 1210 has an output capacitor 1616, with VDC_y across its plates. Each central optimizer 1210 has a fly capacitor 1614 and switches S13 1602, S14 1604, S15 1606, and S16 1608. In addition, the central optimizer 1210 of FIG. 16A has switch S17 1610. Each switch 1602-1610 may be implemented with a transistor. There may also be a diode in parallel with the transistor. The direction of the diodes, if used, is depicted in FIGS. 16A and 16B. FIGS. 10A-10C provide further details for various embodiments of how the switches 1602-1610 might be implemented.

First, operation of the embodiment of the central optimizer 1210 of FIG. 16A will be discussed. The central optimizer 1210 has a bypass mode and a boost mode. For the bypass mode switch S17 is closed (also referred to as "on") and switches S13-S16 are open (also referred to as "off"). In this mode, the voltage VDCx is passed from the input capacitor 1612 to the output capacitor 1616. Thus, in the bypass mode VDCy is substantially equal to VDCx. Note that there may be some non-ideal characteristics of the circuit components that make of the central optimizer 1210. Thus, the output voltage is not necessarily exactly equal to the input voltage. By the output voltage being substantially equal to VDCx, such non-ideal characteristics are considered.

In the boost mode of the central optimizer 1210 of FIG. 16A, switch S17 is off. Switches S13-S16 will be switched on and off during the boost mode. In one embodiment, the boost mode has a first phase in which S14 and S15 are closed and S13 and S16 are open. The fly capacitor 1614 may be charged in the first phase. In one embodiment, the boost mode has a second phase in which S14 and S15 are open and S13 and S16 are closed.

Next, operation of the embodiment of the central optimizer of FIG. 16B will be discussed. The central optimizer 1210 has a bypass mode and a boost mode. For the bypass mode S14 and S16 are on and S13 and S15 are off. In this mode, the voltage VDCx is passed from the input capacitor 1612 to the output capacitor 1616. Thus, in the bypass mode VDCy is substantially equal to VDCx. Note that there may be some non-ideal characteristics of the circuit components that make of the central optimizer 1210. Thus, the output voltage is not necessarily exactly equal to the input voltage. By the output voltage being substantially equal to VDCx, such non-ideal characteristics are considered.

In the boost mode of the central optimizer 1210 of FIG. 16B, switches S13-S16 will be switched on and off. In one embodiment, the boost mode has a first phase in which S14 and S15 are closed and S13 and S16 are open. The fly capacitor 1614 may be charged in the first phase. In one embodiment, the boost mode has a second phase in which S14 and S15 are open and S13 and S16 are closed.

Figure 17A:
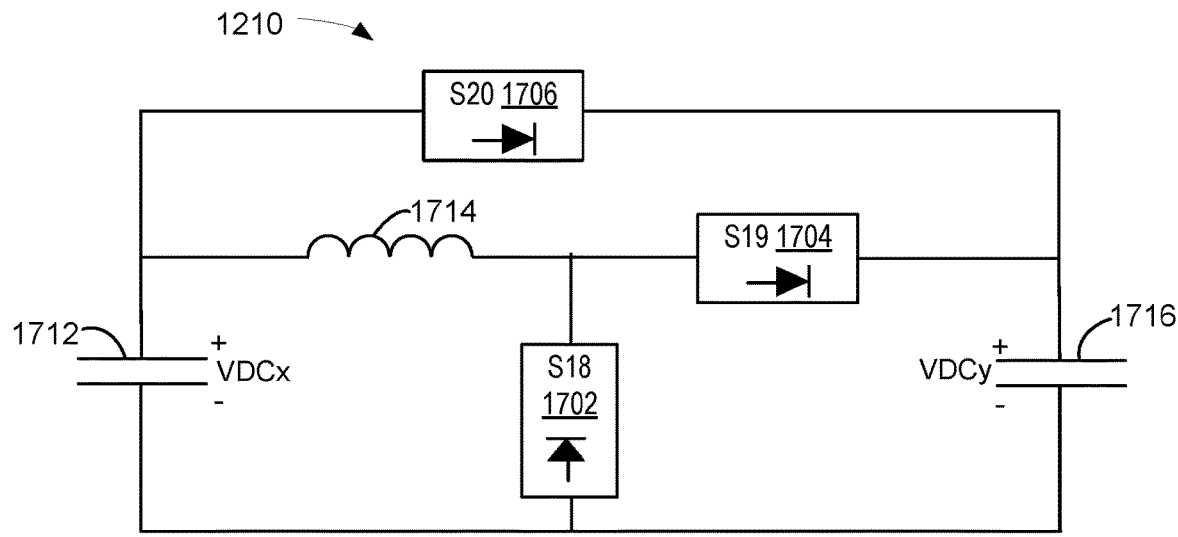
FIGS. 17A and 17B are diagrams of alternative embodiments of a central optimizer.
Figure 17B:
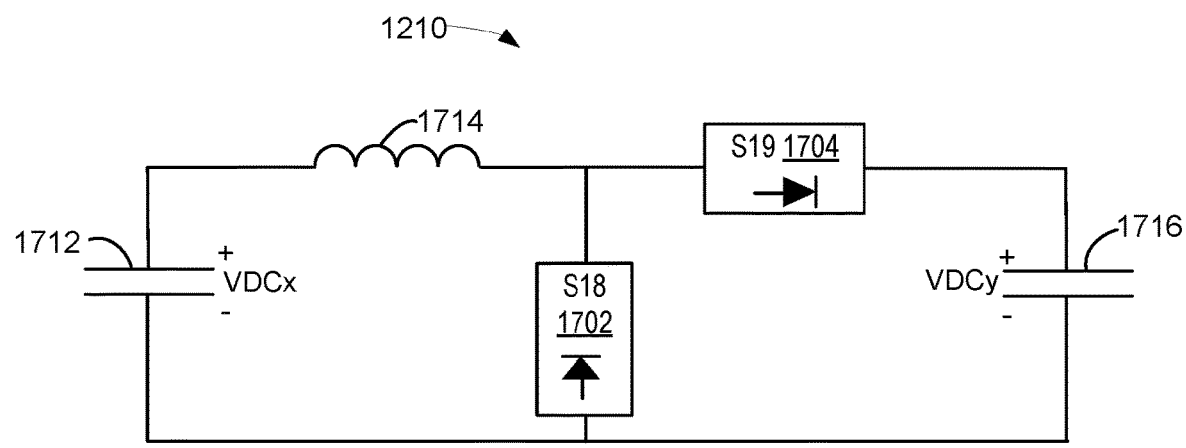

FIGS. 17A and 17B are diagrams of alternative embodiments of at least a portion of a central optimizer 1210. The central optimizers 1210 each comprise a boost converter in these embodiments. The two central optimizers 1210 are similar, with the one in FIG. 17A having a bypass switch S20 1706. Each central optimizers 1210 has an input capacitor 1712, with VDCx across its plates. Each central optimizers 1210 has an output capacitor 1716 with VDCy across its plates. Each central optimizer 1210 has an inductor 1714 and switches S18 1702 and S19 1704. Each switch S18-S20 may be implemented with a transistor. There may also be a diode in parallel with the transistor. The direction of the diodes, if used, is depicted in FIGS. 17A and 17B. FIGS. 10A-10C provide further details for various embodiments of how the switches 1702-1706 might be implemented.

First, operation of the embodiment of the central optimizer of FIG. 17A will be discussed. The central optimizer 1210 has a bypass mode and a boost mode. For the bypass mode switch S20 1706 is on and switches S18 and S19 are off. In this mode, the voltage VDCx is passed from the input capacitor 1712 to the output capacitor 1716. Thus, in the bypass mode VDCy is substantially equal to VDCx. Note that there may be some non-ideal characteristics of the circuit components that make of the central optimizer. Thus, the output voltage is not necessarily exactly equal to the input voltage. By the output voltage being substantially equal to VDCx, such non-ideal characteristics are considered.

In the boost mode of the central optimizer of FIG. 17A, switch S20 1706 is off. Switches S18 and S19 will be switched on and off during the boost mode. In one embodiment, the boost mode has a first phase in which S18 is closed and S19 is open. In one embodiment, the boost mode has a second phase in which S18 is open and S19 is closed.

Next, operation of the embodiment of the central optimizer 1210 of FIG. 17B will be discussed. The central optimizer 1210 has a bypass mode and a boost mode. For the bypass mode switch S19 1704 is closed and S18 1702 is open. In this mode, the voltage VDCx is passed from the input capacitor 1712 to the output capacitor 1716. Thus, in the bypass mode VDCy is substantially equal to VDCx. Note that there may be some non-ideal characteristics of the circuit components that make of the central optimizer. Thus, the output voltage is not necessarily exactly equal to the input voltage. By the output voltage being substantially equal to VDCx, such non-ideal characteristics are considered.

In the boost mode of the central optimizer 1210 of FIG. 17B, switches S18 and S19 will be switched on and off. In one embodiment, the boost mode has a first phase in which S18 is closed and S19 is open. In one embodiment, the boost mode has a second phase in which S18 is open and S19 is closed.

TABLE IX

| PV | $I_{PV}$ | $V_{PV}$ | $P_{PV}$ | $P_{PVT}$ | VDCx | VDCy | $I_{OUTx}$ | Mode | Duty | $V_O$ |
|----|------|------|------|-------|------|------|-------|-------|------|-------|
| 1  | 3    | 24   | 72   | 1632  | 175  | 350  | 9.33  | Buck  | 0.32 | 7.72  |
| 2  | 3    | 24   | 72   |       |      |      | 9.33  | Buck  | 0.32 | 7.72  |
| 3  | 3    | 24   | 72   |       |      |      | 9.33  | Buck  | 0.32 | 7.72  |
| 4  | 3    | 24   | 72   |       |      |      | 9.33  | Buck  | 0.32 | 7.72  |
| 5  | 3    | 24   | 72   |       |      |      | 9.33  | Buck  | 0.32 | 7.72  |
| 6  | 3    | 24   | 72   |       |      |      | 9.33  | Buck  | 0.32 | 7.72  |
| 7  | 10   | 30   | 300  |       |      |      | 9.33  | Boost | 0.07 | 32.17 |
| 8  | 10   | 30   | 300  |       |      |      | 9.33  | Boost | 0.07 | 32.17 |
| 9  | 10   | 30   | 300  |       |      |      | 9.33  | Boost | 0.07 | 32.17 |
| 10 | 10   | 30   | 300  |       |      |      | 9.33  | Boost | 0.07 | 32.17 |

Table IX shows operating conditions for one embodiment of a distributed/central optimizer system having a central optimizer 1210. The conditions are for when the central optimizer 1210 is in a boost mode. The diagram contains the same conditions at ten example PV modules 404 as in Table III. These conditions are for an example system in which there are ten power modules 1206. These conditions may apply to systems 1200, 1300, 1350, 1400, and/or 1450; but are not limited thereto. Table IX differs from Table III in that there is an entry for the voltage (VDCx) at the input of the central optimizer, and an entry for the voltage (VDCy) at the output of the central optimizer. Note that VDCy is the same 350V as $V_{OUT}$ in Table III. Therefore, the voltage at the input of the solar inverter 402 is 350V in both examples.

Note that VDC_x is at 175 V, which corresponds to when the central optimizer 1210 is in a boost mode. In this example, there is a 1:2 ratio between VDCx and VDCy, but other ratios are possible. Note that when in the bypass mode, the ratio is typically 1:1.

There are also significant differences in the operating conditions of the distributed power optimizers 1210. Note that six of the distributed power optimizers are operated in buck mode in both Table III and IX. However, the duty cycle is reduced from 0.63 to 0.32. Moreover, the output voltage of each of these six distributed power optimizers is reduced from 15.44 V to 7.72V. The other four distributed power optimizers are operated in boost mode in both Table III and IX. However, the duty cycle is reduced from 0.53 to 0.07. Moreover, the output voltage of each of these six distributed power optimizers is reduced from 64.34 V to 32.17 V. Recall that having too high of an output voltage may cause significant problems. For example, this can place too much stress on components such as output capacitors. Having the central optimizer 1210 reduces or eliminates such problems. Moreover, note that the input voltage of the solar inverter 402 may be maintained at 350V.

optimizer 1210 is in a boost mode. The diagram contains the same conditions at ten example PV modules 404 as in Table IV. These conditions are for an example system in which there are ten power modules 1206. These conditions may apply to distributed/central optimizer systems 1200, 1300, 1350, 1400, and/or 1450; but are not limited thereto. Table X differs from Table IV in that there is an entry for the voltage (VDCx) at the input of the central optimizer, and an entry for the voltage (VDCy) at the output of the central optimizer. Note that VDCy is the same 350V as $V_{OUT}$ in Table IV. Therefore, the voltage at the input of the solar inverter 402 is 350V in both examples. Recall that in the example in Table IV, the output voltage on optimizer number 10 was too high. For example, anything over 60V might be higher than desired. One option would be to clamp the output voltage of this DC optimizer to 60V. However, this may result in lower power transfer. Also, this may lead to a drop in the inverter voltage. Note again that VDCx is at 175 V, which corresponds to when the central optimizer 1210 is in a boost mode. In this example, there is a 1:2 ratio between VDCx and VDCy, but other ratios are possible. Note that when in the bypass mode, the ratio is typically 1:1.

There are also significant differences in the operating conditions of the distributed power optimizers 1210. Note that nine of the distributed power optimizers are operated in buck mode in Table X. Those distributed power optimizers were operated in boost mode in Table IV. Also noted that the output voltage of each of these nine distributed power optimizers is reduced from 26.58 V to 13.29 V. The last distributed power optimizer in both Table IV and X is in boost mode. However, the duty cycle is reduced from 0.73 to 0.46. Moreover, the output voltage of this distributed power optimizer is reduced from 110.8 V to 55.38V. As noted, having too high of an output voltage on the distributed power optimizer may cause significant problems. Thus,

TABLE X

| PV | $I_{PV}$ | $V_{PV}$ | $P_{PV}$ | $P_{PVT}$ | VDCx | VDCy | $I_{OUT}$ | Mode | Duty | $V_{PO}$ |
|----|------|------|------|-------|------|------|-------|-------|------|-------|
| 1  | 3    | 24   | 72   | 948   | 175  | 350  | 5.42  | Buck  | 0.55 | 13.29 |
| 2  | 3    | 24   | 72   |       |      |      | 5.42  | Buck  | 0.55 | 13.29 |
| 3  | 3    | 24   | 72   |       |      |      | 5.42  | Buck  | 0.55 | 13.29 |
| 4  | 3    | 24   | 72   |       |      |      | 5.42  | Buck  | 0.55 | 13.29 |
| 5  | 3    | 24   | 72   |       |      |      | 5.42  | Buck  | 0.55 | 13.29 |
| 6  | 3    | 24   | 72   |       |      |      | 5.42  | Buck  | 0.55 | 13.29 |
| 7  | 3    | 24   | 72   |       |      |      | 5.42  | Buck  | 0.55 | 13.29 |
| 8  | 3    | 24   | 72   |       |      |      | 5.42  | Buck  | 0.55 | 13.29 |
| 9  | 3    | 24   | 72   |       |      |      | 5.42  | Buck  | 0.55 | 13.29 |
| 10 | 10   | 30   | 300  |       |      |      | 5.42  | Boost | 0.46 | 56.38 |

Table IX shows operating conditions for one embodiment of a distributed/central optimizer system having a central optimizer 1210. The conditions are also for when the central the central optimizer 1210 reduces or eliminates such problems. Moreover, note that the input voltage of the solar inverter 402 may be maintained at 350V.

Figure 18:
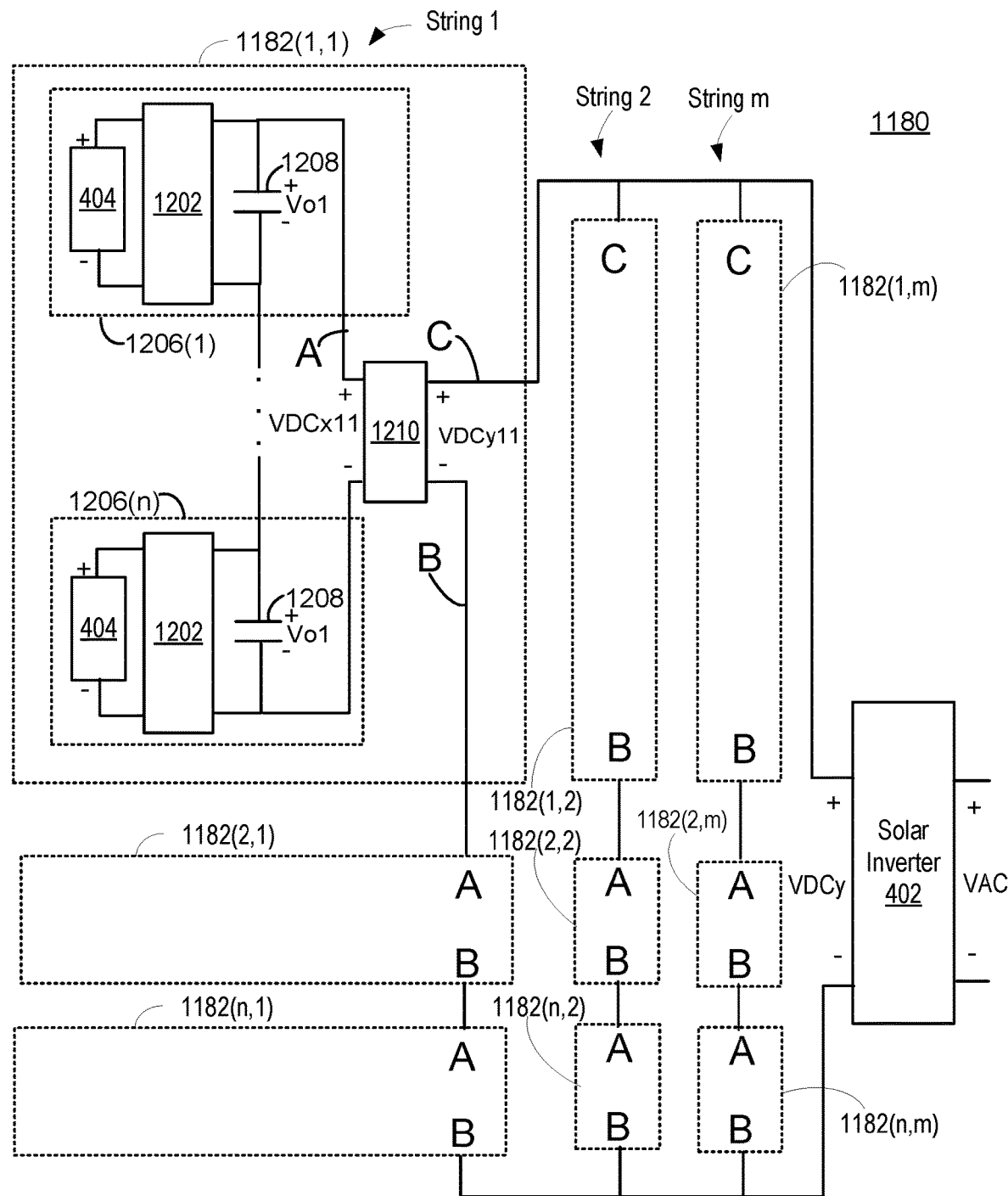
FIG. 18 is a diagram of one embodiment of a photovoltaic power transfer system having multiple central optimizer systems.

FIG. 18 is a diagram of one embodiment of a photovoltaic power transfer system 1800 having multiple central optimizer systems 1802. In this embodiment, the central optimizer systems are connected in series and in parallel. System 1800 has "m" strings (string 1, string 2, string m) of systems 1802. In general, there may be one or more strings. Each string has "n" systems 1802, in the embodiment of FIG. 18. For example, string 1 has systems 1802(1,1), 1802(2,1), . . . 1802(n,1); string 2 has systems 1802(1,2), 1802(2,2), . . . 1802(n,2); string 3 has systems 1802(1,m), 1802(2,m), . . . 1802(n,m). In general, there may be one or more systems in a string. Having multiple strings provides for parallel connections of multiple central optimizer systems 1802.

Some details of one central optimizer system 1802(1,1) are depicted. In this example, central optimizer system 1802(1,1) is similar to distributed/central optimizer system 1200 in FIG. 12. Alternatively, distributed/central optimizer systems based on, but not limited to, distributed/central optimizer systems 1300, 1350, 1400, 1450 or 1500 might be used. The other central optimizer systems may have similar circuit elements, but that is not required.

For reference, several nodes in central optimizer system 1802(1,1) are depicted. Node A refers to the positive input of the central optimizer 1210. Node B refers to the negative output of the central optimizer 1210. In some embodiments, node B is in common with the negative input of the central optimizer 1210 (see, for example, FIGS. 16A, 16B, 17A, and 17B). Node C refers to the positive output of the central optimizer 1210.

In system 1800, node C of the top system 1802 on each string is connected to the positive input of the solar inverter 402. Thus, the positive output of the central optimizer 1210 in systems 1802(1,1), 1802(1, 2), . . . 1802(1, m) are each connected to the positive input of the solar inverter 402.

In system 1800, node B of the bottom system 1802 on each string is connected to the negative input of the solar inverter 402. Thus, the negative output of the central optimizer 1210 in systems 1802(n,1), 1802(n, 2), . . . 1802(n, m) are each connected to the negative input of the solar inverter 402.

In system 1800, node B of system 1802(1,1) is connected to Node A of system 1802(2,1). Assuming that node B is in common with the negative input of the central optimizer 1210, the negative input of the central optimizer 1210 in system 1802(1, 1) is connected to the positive input of the central optimizer 1210 in system 1802(2, 1). Similar connections are depicted for other pairs of systems 1802.

In this configuration, the input terminals of the solar inverter 402 are connected across the series connection of the output of the central optimizers 1210 in String 1. The output voltage of central optimizer 1210 in system 1802(1,1) is labeled as VDCy11. This output voltage is added with the output voltages of central optimizers 1210 in the other systems 1802 in String 1. Likewise, the input terminals of the solar inverter 402 are connected across the series connection of the output of the central optimizers 1210 in the other Strings.

Moreover, each string is able to provide its own string current. Thus, String 1 provides a string current, String 2 provides a string current, and String m provides a string current. These three string currents may add up such that the system 1800 is able to increase the amount of current provided to the solar inverter 402.

In some embodiments, the distributed power optimizers 1202 and the central optimizer 1210 exchange information about conditions in the distributed/central optimizer system. This information may be used to select duty cycles of distributed power optimizers 1202, select a bypass mode of the central optimizer 1210 and/or select a duty cycle of the central optimizer 1210.

Figure 19:
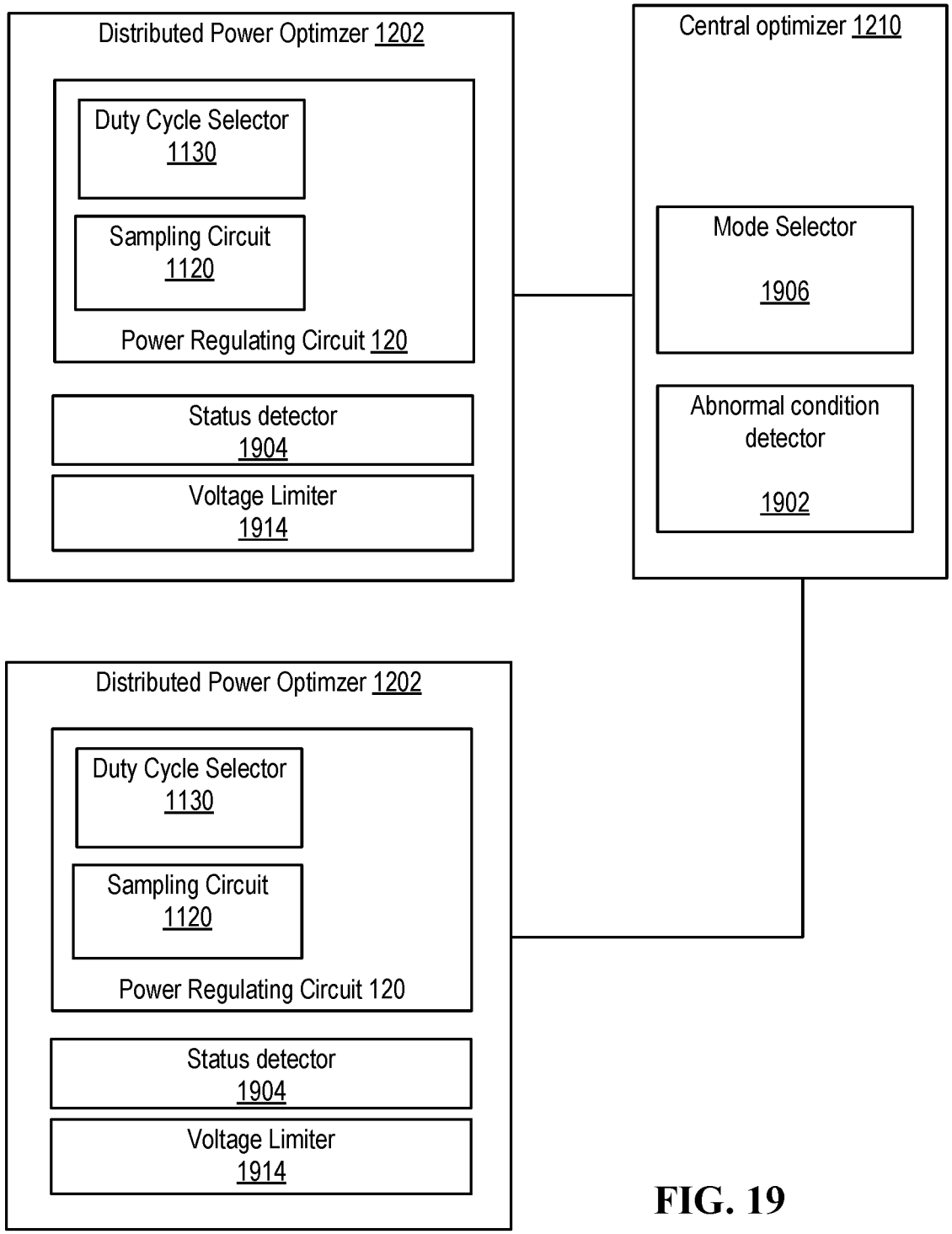
FIG. 19 is a diagram of one embodiment of the distributed power optimizers and the central optimizer.

FIG. 19 is a diagram of one embodiment of the distributed power optimizers 1202 and the central optimizer 1210. The distributed power optimizers 1202 and/or central optimizer 1210 could be used in any of systems 1200, 1300, 1350, 1400, or 1500, but are not limited thereto. The distributed power optimizers 1202 have a status detector 1904, which may be configured to detect operational status of the distributed power optimizer 1202. For example, the status detector 1904 might detect that the output voltage of the distributed power optimizer 1202 needs to be limited. As another example, the status detector 1904 might detect that the output current of the distributed power optimizer 1202 needs to be limited. As another example, the status detector 1904 might detect that the output power of the distributed power optimizer 1202 needs to be limited. Note that the distributed power optimizers 1202 have voltage limiter 1914 which is configured to limit their respective output voltage to some allowed level.

The distributed power optimizers 1202 are configured to report their status to the central optimizer 1210. Examples status include, but are not limited to, a normal state of a distributed power optimizer, an abnormal state of a distributed power optimizer, an output voltage limiting state in which a distributed power optimizer limits its output voltage to an allowed voltage, or an output power limiting state in which a distributed power optimizer limits its output power. Any type of communication methods can be used, e.g., wired, wireless, or power line communication. The distributed power optimizers 1202 could, optionally report their status to each other. Also, the central optimizer 1210 may report the conditions it detects to the distributed power optimizers 1202.

The central optimizer 1210 has an abnormal condition detector 1902, which is configured to detect conditions of the distributed/central optimizer system. For example, the abnormal condition detector 1902 might detect either an over-voltage or an under-voltage condition at its input (e.g., VDCx). As another example, the abnormal condition detector 1902 might detect either an over-voltage or an under-voltage condition at its output (e.g., VDCy). As still another example, the abnormal condition detector 1902 might detect a fault with the AC power grid. In one embodiment, the central optimizer 1210 report abnormal conditions to one or more of the plurality of distributed power optimizers. For example, the central optimizer 1210 might report one or more of: an under-voltage condition at the input of the central optimizer 1210, or an over voltage condition at the input of the central optimizer 1210.

The central optimizer 1210 has mode selector 1906, which is configured to select whether to operate the central optimizer 1210 in a bypass mode or a boost mode. The mode selector 1906 may use input from the abnormal condition detector 1902 and/or the distributed power optimizers 1202 to make the mode selection. Note that mode selector 1906 and abnormal condition detector 1902 are not required to be located in the central optimizer 1210. The abnormal condition detector 1902 and mode selector 1906 are examples of control logic.

The distributed power optimizers 1202 also have a power regulating circuit 120, in this embodiment. The power regulating circuit 120 may operate in a similar manner as the power regulating circuit 120 discussed with respect to FIG. 11A. The power regulating circuit 120 is not required to be located in the distributed power optimizer 1202. The status detector 1904 is an example of control logic.

Figure 20:
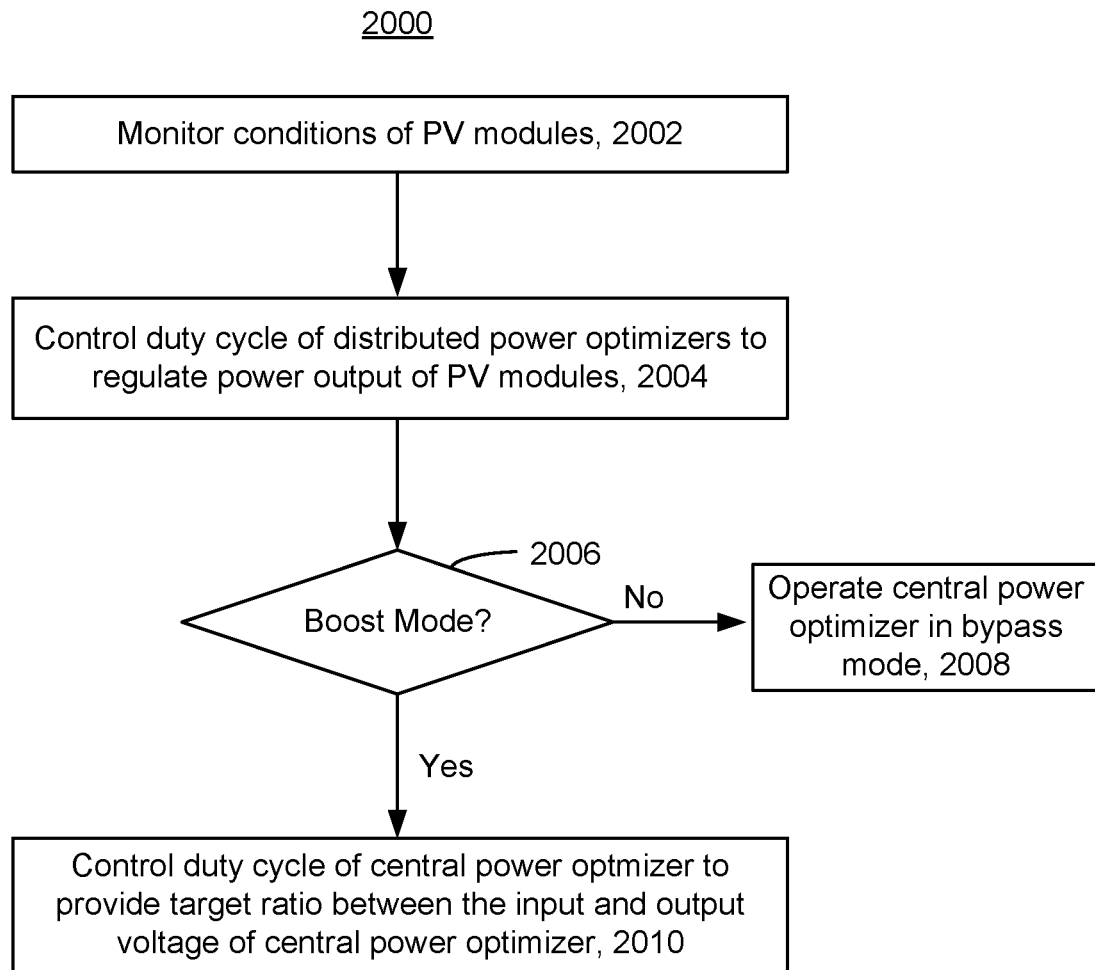
FIG. 20 is a flowchart of one embodiment of a process of operating a distributed/central optimizer system.

FIG. 20 is a flowchart of one embodiment of a process 2000 of operating a distributed/central optimizer system. The process 2000 might be performed by the distributed/central optimizer system in any of FIG. 12, 13A, 13B, 14, 15, 18 or 19, but is not limited thereto. Step 2002 includes monitoring a condition of each of a plurality of photovoltaic modules 404. In one embodiment, the condition includes one or more of power output, voltage output, or current output. In one embodiment, step 2002 is performed by sampling circuit 1120.

Step 2004 includes controlling a duty cycle of each of the distributed power optimizers 1210 to regulate a power output of the PV modules 404. In one embodiment, step 2002 is performed by duty cycle selector 1130 in power regulating circuit 120.

Step 2004 may result in generating, by a plurality of distributed power optimizers 1210, a total DC voltage from the combined DC voltages of the photovoltaic modules. The generating, by a plurality of distributed power optimizers, a total DC voltage from the combined DC voltages of the photovoltaic modules may step up or step down ones of the DC voltages from the plurality of photovoltaic modules 404. In one embodiment, this total DC voltage is provided to the input of the central optimizer 1210.

Process 2000 is not limited to any particular technique to regulate the power outputs of the PV modules 404. In some embodiments an attempt is made to operate each PV module 404 at a maximum power point. As one example, a hill climbing technique may be used. One example of a hill climbing technique is commonly referred to as "perturb and observe". In perturb and observe, the power regulating circuit 120 may adjust the duty cycle of a given distributed power optimizer 1202 slightly and observe the impact on current and voltage (and hence power) output by the corresponding PV module 404. Such adjustments may be made until a maximum power point is located. Since environmental conditions (e.g., solar radiation, operating temperature) may change over time, the power regulating circuit 120 may once again seek a maximum power point at periodic intervals. Many techniques other than perturb and observe may be used.

Step 2006 includes a determination of whether the central optimizer 1210 should be operated in a boost mode or a bypass mode. In the boost mode, the voltage at the input terminals (e.g., VDCx) of the central optimizer 1210 is less than the voltage at the output terminals (e.g., VDCy) of the central optimizer 1210. In the bypass mode, the voltage at the input terminals (e.g., VDCx) is substantially the same as the voltage at the output terminals (e.g., VDCy. By "substantially the same" it is meant that the same voltage is targeted at the input and output, but due to factors such as non-ideal circuit elements, there may be some difference in the input and output voltages. For example, there may be some resistance along a conductive path between the input and output of the central optimizer 1210, wherein there may be a voltage drop between the input and output of the central optimizer 1210.

A variety of techniques may be used to determine whether the central optimizer 1210 should operate in a boost mode or a bypass mode. In one embodiment, the solar inverter 402 determines whether it is having difficulty maintaining the voltage at its input terminals (e.g., VDCy). Note that the solar inverter 402 may be configured to attempt to regulate the voltage at its input terminals (e.g., VDCy) to some target voltage, such as 350 V. If the solar inverter 402 is not able to maintain the voltage at its input terminals (e.g., VDCy) at that target, the solar inverter 402 might not operate efficiently and/or might not be able to provide a suitable AC voltage at its output terminals (e.g., VAC). Thus, in one embodiment, the solar inverter 402 sends a signal to the central optimizer 1210 or the power regulating circuit 120 when the solar inverter 402 is having trouble maintaining the voltage at its input terminals (e.g., VDCy). In one embodiment, the abnormal condition detector 1902 determines that it is having a difficult time maintaining a target voltage at its output terminals (e.g., VDCy). In one embodiment, the abnormal condition detector 1902 determines that the voltage at its input terminals (e.g., VDCx) is too low for it to be able to provide the target voltage on its output.

In one embodiment, the status detector 1904 in the power regulating circuit 120 sends status to the central optimizer 1210 that indicates that the central optimizer 1210 should be operated in boost mode (or alternatively, bypass mode). In one embodiment, the status detector 1904 determines that the distributed power optimizer cannot safely meet a target output voltage. For example, voltage limiter 1914 may have limited the output voltage of the distributed power optimizer 1202 to some maximum allowed level. Based on this status, the central optimizer 1210 may determine that it should operate in the boost mode. The central optimizer 1210 may determine that it should operate in the boost mode based on the combined status from each of the distributed power optimizers 1202.

Responsive to a determination in step 2006 that the central optimizer 1210 should not be operated in a boost mode, the central optimizer 1210 is operated in a bypass mode in step 2008.

In one embodiment, the bypass mode is selected by keeping switch S17 1610 in FIG. 16A on (or closed) all the time. Additionally, all of the other switches (S13-S16) may be off (or open) for the bypass mode. Note that one embodiment of the bypass mode, the central optimizer 1210 is operated very efficiently. For example, there does not need to be any switching during one embodiment of the bypass mode. Thus, there does not need to be any charging/discharging of capacitors in one embodiment of the bypass mode (at least once a steady state is achieved). Also, there does not need to be any energy storage/discharge of inductors in one embodiment of the bypass mode (at least once a steady state is achieved).

In one embodiment, the bypass mode is selected by keeping switch S14 and S16 in FIG. 16B on (or closed) all the time. Additionally, the other switches (S13 and S15) may be off (or open) for the bypass mode.

In one embodiment, the bypass mode is selected by keeping switch S20 1706 in FIG. 17A on (or closed) all the time. Additionally, all of the other switches (S18-S19) may be off (or open) for the bypass mode.

In one embodiment, the bypass mode is selected by keeping switch S19 1704 in FIG. 17B on (or closed) all the time. Additionally, the other switch (S18) may be off (or open) for the bypass mode.

Responsive to a determination in step 2006 that the central optimizer 1210 should be operated in a boost mode, the central optimizer 1210 is operated in a boost mode in step 2010. Also, the duty cycle of the central optimizer may be established to achieve a desired ratio VDCx:VDCy.

In one embodiment, the boost mode is selected by keeping switch S17 1610 in FIG. 16A off (or open) all the time. Additionally, the other switches (S13-S16) may be controlled for the desired ratio VDCx:VDCy. In one embodiment, the boost mode has a first phase in which S14 and S15 are closed and S13 and S16 are open. The fly capacitor 1614 may be charged in the first phase. In one embodiment, the boost mode has a second phase in which S14 and S17 are open and S13 and S16 are closed.

In the boost mode of the central optimizer 1210 of FIG. 16B, switches S13-S16 will be switched on and off. In one embodiment, the boost mode has a first phase in which S14 and S15 are closed and S13 and S16 are open. The fly capacitor 1614 may be charged in the first phase. In one embodiment, the boost mode has a second phase in which S14 and S15 are open and S13 and S16 are closed.

In the boost mode of the central optimizer of FIG. 17A, switch S20 1706 is off. Switches S18 and S19 will be switched on and off during the boost mode. In one embodiment, the boost mode has a first phase in which S18 is closed and S19 is open. In one embodiment, the boost mode has a second phase in which S18 is open and S19 is closed.

In the boost mode of the central optimizer 1210 of FIG. 17B, switches S18 and S19 will be switched on and off. In one embodiment, the boost mode has a first phase in which S18 is closed and S19 is open. In one embodiment, the boost mode has a second phase in which S18 is open and S19 is closed.

Figure 21:
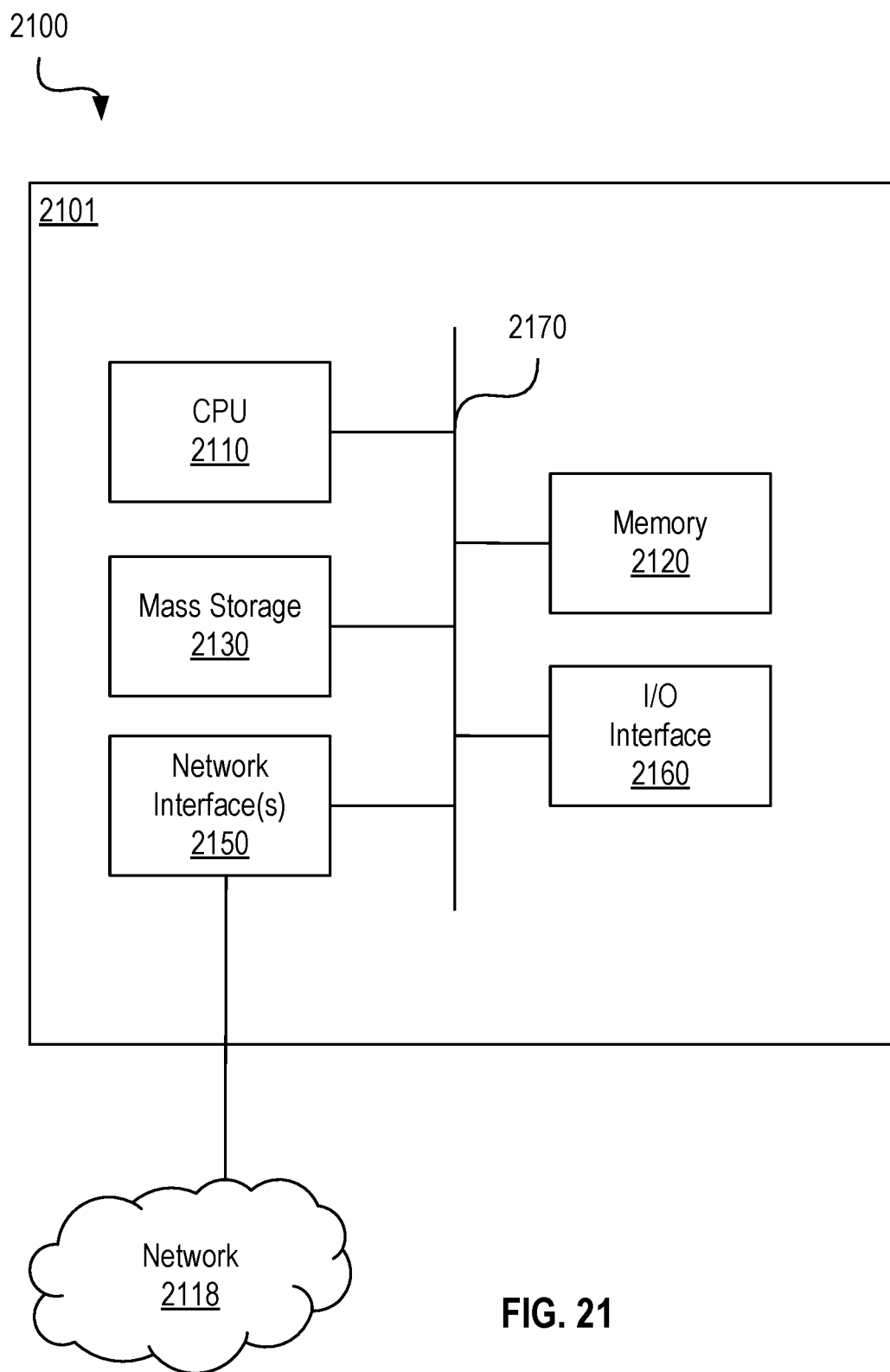
FIG. 21 is an example computer system.

FIG. 21 is an example computer system 2100. Specific devices (e.g., DC to DC converter 302, solar inverter 402, power regulating circuit 120, status detector 1904, voltage limiter 1914, sampling circuit 1120, duty cycle selector 1130, central optimizer 1210, abnormal condition detector 1902, mode selector 1906, distributed power optimizer 1202) may utilize all of the components shown, or only a subset of the components, and levels of integration may vary from device to device. Furthermore, a device may contain multiple instances of a component, such as multiple processing units, processors, memories, transmitters, receivers, etc. The network system may comprise a processing unit 2101 equipped with one or more input/output devices, such as network interfaces, storage interfaces, and the like. The processing unit 2101 may include a central processing unit (CPU) 2110, a memory 2120, a mass storage device 2130, and an I/O interface 2160 connected to a bus. The bus may be one or more of any type of several bus architectures including a memory bus or memory controller, a peripheral bus or the like.

The CPU 2110 may comprise any type of electronic data processor. The CPU 2110 may be configured to implement any of the schemes described herein, such as the processes illustrated in FIGS. 11B and 20. The memory 2120 may comprise any type of system memory such as static random access memory (SRAM), dynamic random access memory (DRAM), synchronous DRAM (SDRAM), read-only memory (ROM), a combination thereof, or the like. In an embodiment, the memory 2120 may include ROM for use at boot-up, and DRAM for program and data storage for use while executing programs. In embodiments, the memory 2120 is non-transitory. The mass storage device 2130 may comprise any type of storage device configured to store data, programs, and other information and to make the data, programs, and other information accessible via the bus. The mass storage device 2130 may comprise, for example, one or more of a solid state drive, hard disk drive, a magnetic disk drive, an optical disk drive, or the like.

The processing unit 2101 also includes one or more network interfaces 2150, which may comprise wired links, such as an Ethernet cable or the like, and/or wireless links to access nodes or one or more networks 2180. The network interface 2150 allows the processing unit 2101 to communicate with remote units via the network 2180. For example, the network interface 2150 may provide wireless communication via one or more transmitters/transmit antennas and one or more receivers/receive antennas. In an embodiment, the processing unit 2101 is coupled to a local-area network or a wide-area network for data processing and communications with remote devices, such as other processing units, the Internet, remote storage facilities, or the like.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The aspects of the disclosure herein were chosen and described in order to best explain the principles of the disclosure and the practical application, and to enable others of ordinary skill in the art to understand the disclosure with various modifications as are suited to the particular use contemplated.

For purposes of this document, each process associated with the disclosed technology may be performed continuously and by one or more computing devices. Each step in a process may be performed by the same or different computing devices as those used in other steps, and each step need not necessarily be performed by a single computing device.

Aspects of the present disclosure are described herein with reference to flowchart illustrations and/or block diagrams of methods, apparatuses (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

The terminology used herein is for the purpose of describing particular aspects only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A system comprising:
   a plurality of photovoltaic modules, each having a DC voltage output;
   a plurality of distributed power optimizers, each distributed power optimizer has an input connected to the DC voltage output of one of the photovoltaic modules and an output configured to provide a DC voltage; and a central optimizer having an output configured to output a DC voltage and an input configured to receive a voltage that is a summation of the DC voltages from the outputs of a set of at least two of the distributed power optimizers.

2. The system of claim 1, wherein the central optimizer is configured to operate in a bypass mode and in a boost mode.

3. The system of claim 2, further comprising control logic configured to:
switch the central optimizer between the bypass mode and the boost mode responsive to a condition of one or more of the plurality of distributed power optimizers.

4. The system of claim 2, further comprising control logic configured to:
switch the central optimizer from the bypass mode to the boost mode responsive to a magnitude of the DC voltage that is output from the output of one or more of the plurality of distributed power optimizers reaching a maximum allowed amount.

5. The system of claim 2, further comprising control logic configured to:
switch the central optimizer from the bypass mode to the boost mode responsive to the central optimizer being unable to maintain the DC voltage at the output of the central optimizer at a target level.

6. The system of claim 2, wherein the central optimizer comprises a switch between the input of the central optimizer and the output of the central optimizer, wherein in the bypass mode the switch connects the input of the central optimizer directly to the output of the central optimizer.

7. The system claim 2, further comprising control logic configured to reduce the summation of the DC voltages from the outputs of the plurality of distributed power optimizers when the central optimizer is in the boost mode relative to the summation of the DC voltages from the outputs of the plurality of distributed power optimizers when the central optimizer is in the bypass mode.

8. The system claim 2, wherein the central optimizer is configured to maintain the DC voltage at the output of the central optimizer at substantially the same magnitude in the boost mode and the bypass mode.

9. The system of claim 1, further comprising a DC to AC converter having a DC voltage input and an AC voltage output, wherein the DC voltage input of the DC to AC converter is coupled to the output of the central optimizer.

10. The system claim 1, further comprising control logic configured to report operational status of the plurality of distributed power optimizers to the central optimizer, wherein the operational status comprises one or more of: a normal state of a distributed power optimizer, an output voltage limiting state in which a distributed power optimizer limits the DC voltage at the output, or an output power limiting state in which a distributed power optimizer limits its output power.

11. The system claim 1, further comprising control logic configured to report abnormal conditions to one or more of the plurality of distributed power optimizers, wherein the abnormal conditions comprises one or more of: an under-voltage condition at the input of the central optimizer, or an over voltage condition at the input of the central optimizer.

12. A method of regulating power, comprising:
operating a plurality of distributed power optimizers to regulate power output of a plurality of photovoltaic modules, each distributed power optimizer having an output that outputs a DC voltage and an input connected to a DC voltage output of one of the photovoltaic modules;
providing a summation of the DC voltages that are output by the plurality distributed power optimizers to an input of a central optimizer;
operating the central optimizer in a boost mode or a bypass mode; and
providing a DC output voltage of an output of the central optimizer to an input of a solar inverter.

13. The method of claim 12, wherein operating the central optimizer in a boost mode or a bypass mode comprises:
operating the central optimizer in the boost mode responsive to a condition of one or more of the plurality of distributed power optimizers.

14. The method of claim 13, wherein the condition is a first of the plurality of distributed power optimizers having its output voltage clamped to a maximum allowed voltage.

15. The method of claim 13, wherein operating the central optimizer in a boost mode or a bypass mode comprises:
operating the central optimizer in the bypass mode responsive to all of the plurality of distributed power optimizers reporting normal state; and
operating the central optimizer in the boost mode responsive to one of more of the plurality of distributed power optimizers reporting abnormal state.

16. The method of claim 12, wherein operating the central optimizer in a boost mode or a bypass mode comprises:
maintaining the same DC voltage at the output of the central optimizer in both the boost mode and the bypass mode; and
decreasing the ratio of the DC voltage at the input to the output of the central optimizer when going from the bypass mode to the boost mode.

17. A photovoltaic power transfer system, comprising:
a plurality of central optimizer systems connected in series and/or parallel, each central optimizer system comprising:
a plurality of power modules connected in series, each of the power modules comprising:
a plurality of photovoltaic modules, each having a DC voltage output;
a plurality of distributed power optimizers, each distributed power optimizer has an input connected to the DC voltage output of one of the photovoltaic modules and an output configured to provide a DC voltage; and
a central optimizer having an output configured to provide a DC voltage and an input configured to receive a voltage that is a summation of the DC voltages from the outputs of a set of at least two of the distributed power optimizers.

18. The system of claim 17, further comprising:
a solar inverter having an input that receives a summation of the DC voltages from the outputs of the central optimizers in a series connected string of the central optimizer systems.

19. The system of claim 18, wherein the plurality of central optimizer systems comprises a plurality of series connected strings of the central optimizer systems connected in parallel, wherein the solar inverter input receives a summation of the DC voltages from the outputs of the central optimizers in each of the series connected strings.

20. The system of claim 17, wherein each of the central optimizers is configured to operate in a bypass mode and in a boost mode; and
further comprising control logic configured to switch ones of the central optimizers between the bypass mode and the boost mode responsive to a condition of one or more of the plurality of distributed power optimizers.

* * * * *

UNITED STATES PATENT AND TRADEMARK OFFICE
CERTIFICATE OF CORRECTION

PATENT NO. : 10,665,743 B2
APPLICATION NO. : 15/650370
DATED : May 26, 2020
INVENTOR(S) : Dai et al.

Page 1 of 1

It is certified that error appears in the above-identified patent and that said Letters Patent is hereby corrected as shown below:

On the Title Page

Item (57) Abstract, Line 7: After "photovoltaic" and before "may" delete "modules, and" and replace with -- module and --.

In the Claims

Column 30, Line 23 (Claim 15): After "one" and before "more" delete "of" and replace with -- or --.

Signed and Sealed this
Twenty-seventh Day of October, 2020

Andrei Iancu
*Director of the United States Patent and Trademark Office*